United States Patent
Hinnen et al.

(10) Patent No.: US 9,939,735 B2
(45) Date of Patent: Apr. 10, 2018

(54) METHOD OF DETERMINING FOCUS, INSPECTION APPARATUS, PATTERNING DEVICE, SUBSTRATE AND DEVICE MANUFACTURING METHOD

(71) Applicant: ASML Netherlands B.V., Veldhoven (NL)

(72) Inventors: Paul Christiaan Hinnen, Veldhoven (NL); Shu-jin Wang, Breugel (NL); Christian Marinus Leewis, Maastricht (NL); Kuo-Feng Pao, Taipei (TW)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/429,952

(22) Filed: Feb. 10, 2017

(65) Prior Publication Data

US 2017/0153554 A1 Jun. 1, 2017

Related U.S. Application Data

(62) Division of application No. 14/410,496, filed as application No. PCT/EP2013/061370 on Jun. 3, 2013, now Pat. No. 9,594,299.

(Continued)

(51) Int. Cl.
*G03F 7/20* (2006.01)
*G03F 1/42* (2012.01)

(52) U.S. Cl.
CPC ............ *G03F 7/70641* (2013.01); *G03F 1/42* (2013.01)

(58) Field of Classification Search
CPC .......................... G03F 7/70641; G03F 9/7026
(Continued)

(56) References Cited

U.S. PATENT DOCUMENTS 6,777,139 B2   8/2004   Baselmans
7,180,576 B2   2/2007   Hansen
(Continued)

FOREIGN PATENT DOCUMENTS

CN   102272678 A   7/2011
JP   H08-213306 A   8/1996
(Continued)

OTHER PUBLICATIONS

English-language abstract for JP H08-213306 A, published Aug. 20, 1996; 1 page.

(Continued)

*Primary Examiner* — Hung Henry Nguyen
(74) *Attorney, Agent, or Firm* — Sterne, Kessler, Goldstein & Fox P.L.L.C.

(57) ABSTRACT

A method of determining focus of a lithographic apparatus has the following steps. Using the lithographic process to produce first and second structures on the substrate, the first structure has features which have a profile that has an asymmetry that depends on the focus and an exposure perturbation, such as dose or aberration. The second structure has features which have a profile that is differently sensitive to focus than the first structure and which is differently sensitive to exposure perturbation than the first structure. Scatterometer signals are used to determine a focus value used to produce the first structure. This may be done using the second scatterometer signal, and/or recorded exposure perturbation settings used in the lithographic process, to select a calibration curve for use in determining the focus value using the first scatterometer signal or by using a model with parameters related to the first and second scatterometer signals.

20 Claims, 21 Drawing Sheets

Related U.S. Application Data

(60) Provisional application No. 61/740,406, filed on Dec. 20, 2012, provisional application No. 61/663,115, filed on Jun. 22, 2012.

(58) Field of Classification Search
USPC .............................. 355/52, 55; 430/5, 20, 30
See application file for complete search history.

(56) References Cited

U.S. PATENT DOCUMENTS

| | | | |
|---|---|---|---|
| 7,352,453 | B2 | 4/2008 | Mieher et al. |
| 7,439,001 | B2 | 10/2008 | Ausschnitt et al. |
| 8,208,122 | B2 | 6/2012 | Staals et al. |
| 9,182,682 | B2 | 11/2015 | Cramer et al. |
| 9,466,100 | B2 * | 10/2016 | Choi .................... G06T 7/0004 |
| 9,594,299 | B2 | 3/2017 | Hinnen et al. |
| 2003/0123052 | A1 * | 7/2003 | Ausschnitt ......... G01M 11/0264 356/124 |
| 2003/0156276 | A1 * | 8/2003 | Bowes .................. G01B 11/26 356/124 |
| 2004/0233445 | A1 | 11/2004 | Littau et al. |
| 2006/0132744 | A1 * | 6/2006 | Hauschild ........... G03F 7/70641 355/55 |
| 2011/0027704 | A1 | 2/2011 | Cramer et al. |
| 2011/0043791 | A1 | 2/2011 | Smilde et al. |
| 2011/0249247 | A1 | 10/2011 | Cramer et al. |
| 2012/0044472 | A1 | 2/2012 | Den Boef et al. |
| 2012/0123581 | A1 | 5/2012 | Smilde et al. |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2010/130600 A1 | 11/2010 |

OTHER PUBLICATIONS

Charley, A.-L., et al., "Focus and dose de-convolution technique for improved CD control of immersion clusters," Proceedings of SPIE, Metrology, Inspection, and Process Control for Microlithography XXIV, vol. 7638, 2010; pp. 763808-1 to 763808-8.

Hinnen, P., et al., "Scatterometry-based on-product focus measurement and monitoring," Proceedings of 24$^{th}$ Annual SEMI Advanced Semiconductor Manufacturing Conference (ASMC), May 2013; pp. 352-359.

International Search Report directed to related International Patent Application No. PCT/EP2013/061370, dated Dec. 12, 2013; 4 pages.

International Preliminary Report on Patentability and Written Opinion of the International Searching Authority directed to related International Patent Application No. PCT/EP2013/061370, dated Dec. 23, 2014; 9 pages.

Non-Final Office Action dated Jun. 29, 2016, in U.S. Appl. No. 14/410,496, Hinnen et al., filed Dec. 22, 2014; 7 pages.

Notice of Allowance dated Oct. 27, 2016, in. U.S. Appl. No. 14/410,496, Hinnen et al., filed Dec. 22, 2014; 7 pages.

\* cited by examiner

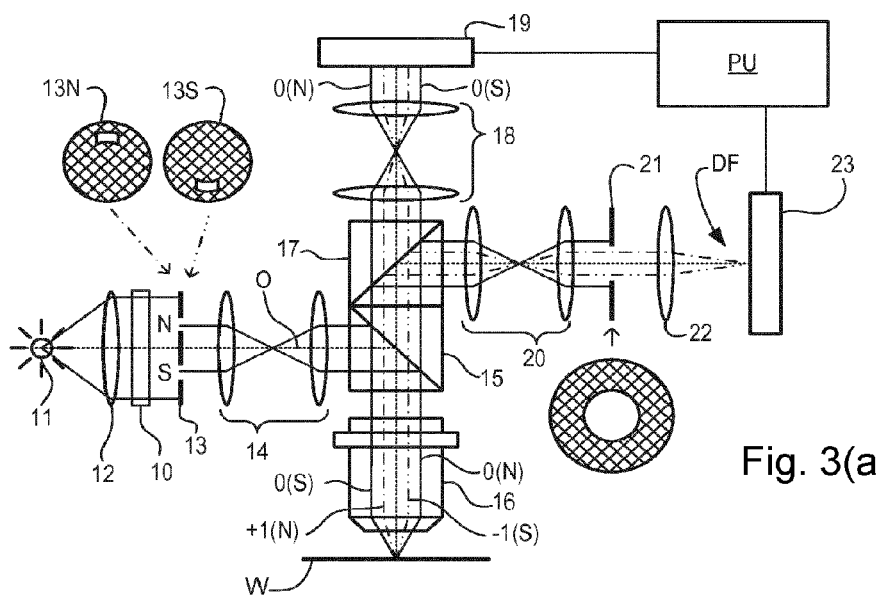
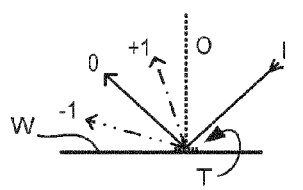
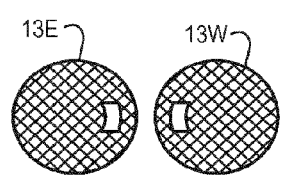
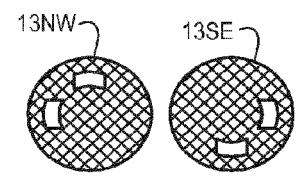
Fig. 3(b)    Fig. 3(c)    Fig. 3(d)
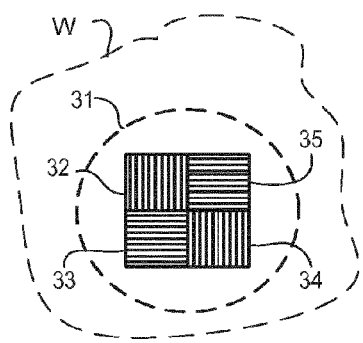
Fig. 4 (PRIOR ART)
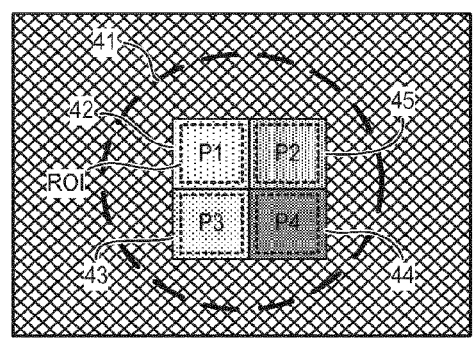
Fig. 5 (PRIOR ART)

METHOD OF DETERMINING FOCUS, INSPECTION APPARATUS, PATTERNING DEVICE, SUBSTRATE AND DEVICE MANUFACTURING METHOD

This application incorporates by reference in their entireties U.S. patent application Ser. No. 14/410,496, 371(c) Date Dec. 22, 2014, International Application No. PCT/EP2013/061370, Filed Jun. 3, 2013, U.S. provisional application 61/740,406, filed Dec. 20, 2012 and U.S. provisional application 61/663,115, filed Jun. 22, 2012.

BACKGROUND

Field of the Invention

The present invention relates to methods and apparatus for determining focus of a lithographic apparatus usable, for example, with pupil-plane detection or dark-field scatterometry in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay (the accuracy of alignment of two layers in a device) and defocus of the lithographic apparatus. Recently, various forms of scatterometers have been developed for use in the lithographic field. These devices direct a beam of radiation onto a target structure, for example a grating, and measure one or more properties of the scattered radiation—e.g., intensity at a single angle of reflection as a function of wavelength, intensity at one or more wavelengths as a function of reflected angle, or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods, library searches, and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark-field scatterometry in which the zeroth order of diffraction (corresponding to a specular reflection) is blocked, and only higher orders processed.

Diffraction-based overlay using dark-field detection of the diffraction orders enables overlay measurements on smaller target structures. These targets can be smaller than the illumination spot and may be surrounded by product structures on a wafer. Multiple targets can be measured in one image.

In the known metrology technique, overlay measurement results are obtained by measuring the target structure, such as a grating, twice under certain conditions, while either rotating the target or changing the illumination mode or imaging mode to obtain separately the $-1^{st}$ and the $+1^{st}$ scatterometer signals, in this example diffraction order intensities. Comparing these intensities for a given grating provides a measurement of asymmetry in the grating.

Asymmetry in a pair of stacked grating structures can be used as an indicator of overlay error. Similarly, asymmetry in a focus-sensitive grating can be used as an indicator of defocus. A focus-sensitive target structure produced by a lithographic apparatus may have at least one feature which has a profile that has an asymmetry that depends on the focus of the lithographic apparatus on the substrate. Focus measurement results may be obtained using the same measurement of asymmetry in the target as used for obtaining overlay measurement results. The asymmetry thus obtained is related to defocus. The relationship between measured asymmetry and defocus can be determined by experimentation.

However, any effect in the scatterometer pupil that leads to an asymmetry change in the scatterometer pupil will be attributed to scanner defocus.

SUMMARY

It is desirable to improve the accuracy of the focus measurement. Furthermore, although the invention is not limited to this, it would be of great advantage, if this could be applied to small target structures that can be read out with the dark-field image-based technique.

According to a first aspect, there is provided a method of determining focus of a lithographic apparatus used in a lithographic process on a substrate, the method comprising the steps: receiving a substrate comprising a first structure produced using the lithographic process; detecting scattered radiation while illuminating the first structure with radiation to obtain a first scatterometer signal; using the first scatterometer signal to determine a focus value used to produce the first structure, based on the first structure having at least one feature which has a profile that has an asymmetry that depends on the focus and the exposure perturbation of the lithographic apparatus at the substrate, and based on knowledge of exposure perturbation used to produce the first structure.

According to a second aspect, there is provided an inspection apparatus for determining focus of a lithographic apparatus used in a lithographic process on a substrate, the inspection apparatus comprising an illumination system configured to illuminate with radiation a first structure produced using the lithographic process on the substrate; a detection system configured to detect scattered radiation arising from illumination of the first structure to obtain a first scatterometer signal; and a processor configured to use the first scatterometer signal to determine a focus value used to produce the first structure, based on the first structure having at least one feature which has a profile that has an asymmetry that depends on the focus and the exposure perturbation of the lithographic apparatus at the substrate, and based on knowledge of exposure perturbation used to produce the first structure.

According to a third aspect, there is provided a patterning device for determining focus of a lithographic apparatus used in a lithographic process on a substrate, the patterning device comprising a target pattern comprising: a first sub-pattern configured to produce a first structure using the lithographic process, the first structure having at least one feature which has a profile that has an asymmetry that depends on the focus and exposure perturbation of the lithographic apparatus at the substrate; and a second sub-pattern configured to produce a second structure using the lithographic process, the second structure having at least one feature which has a profile that has a form that depends on the focus and the exposure perturbation of the lithographic apparatus at the substrate but which is differently sensitive to the focus of the lithographic apparatus at the substrate than the first structure and which is differently sensitive to an exposure perturbation of the lithographic apparatus than the first structure.

According to a fourth aspect, there is provided a substrate for determining focus of a lithographic apparatus used in a lithographic process on the substrate, the substrate comprising a target comprising: a first sub-pattern configured to produce a first structure using the lithographic process, the first structure having at least one feature which has a profile that has an asymmetry that depends on the focus and exposure perturbation of the lithographic apparatus at the substrate; and a second sub-pattern configured to produce a second structure using the lithographic process, the second structure having at least one feature which has a profile that has a form that depends on the focus and exposure perturbation of the lithographic apparatus at the substrate but which is differently sensitive to the focus of the lithographic apparatus on the substrate than the first structure and which is differently sensitive to exposure perturbation of the lithographic apparatus than the first structure.

According to a fifth aspect, there is provided a method of manufacturing devices wherein a device pattern is applied to a series of substrates using a lithographic process, the method including determining focus of the lithographic apparatus using at least one of the substrates using a method according to the first aspect, and controlling the lithographic process for later substrates in accordance with the result of the method of determining focus.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 3A-3D comprises (a) a schematic diagram of a dark field scatterometer for use in measuring targets according to examples of the invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures.

FIG. 4 depicts a known form of multiple grating target and an outline of a measurement spot on a substrate.

FIG. 5 depicts an image of the target of FIG. 4 obtained in the scatterometer of FIG. 3.

Figure 6:
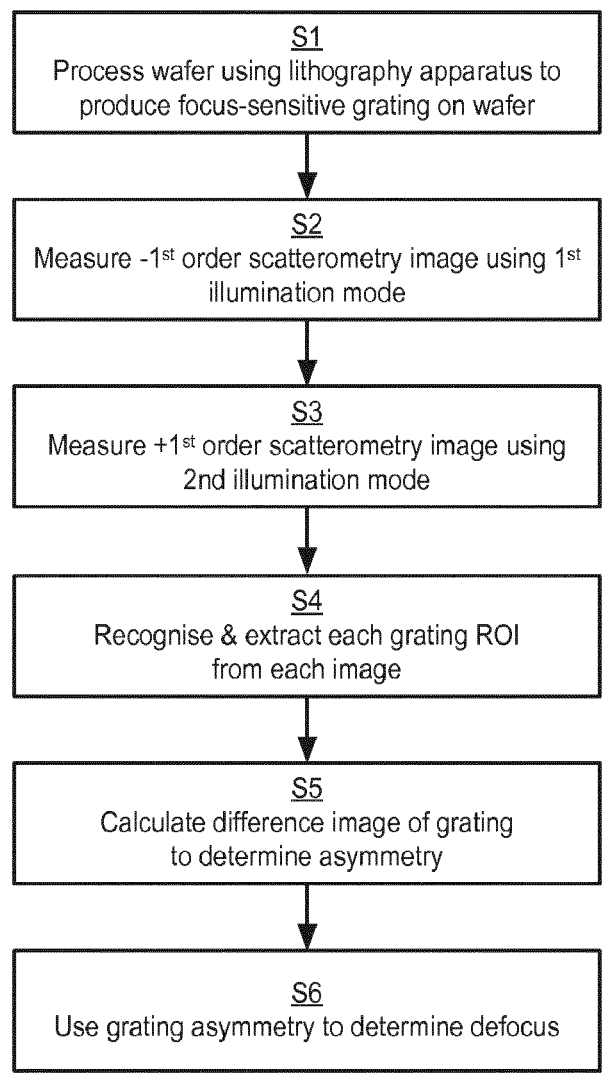

FIG. 6 is a flowchart showing the steps of a defocus measurement method using the scatterometer of FIG. 3 and adaptable to form an example of the present invention.

Figure 7:
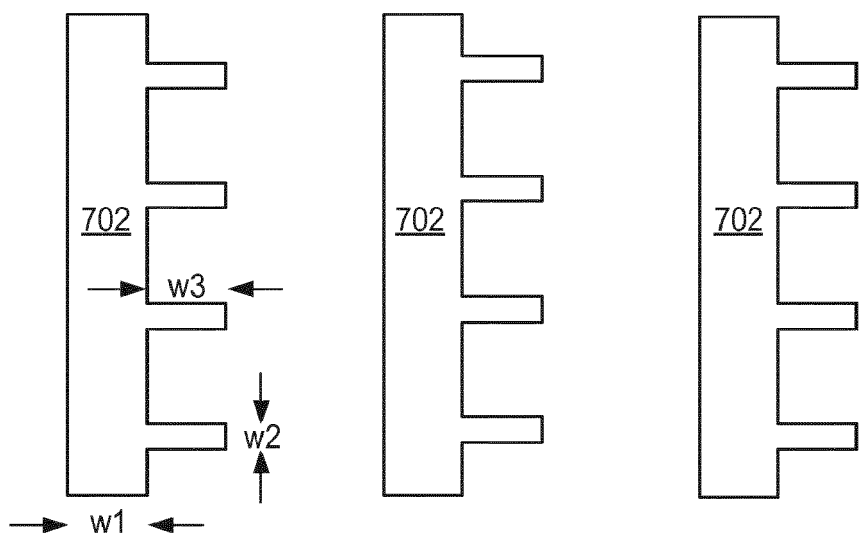

FIG. 7 illustrates a focus-sensitive asymmetric grating pattern.

Figure 8:
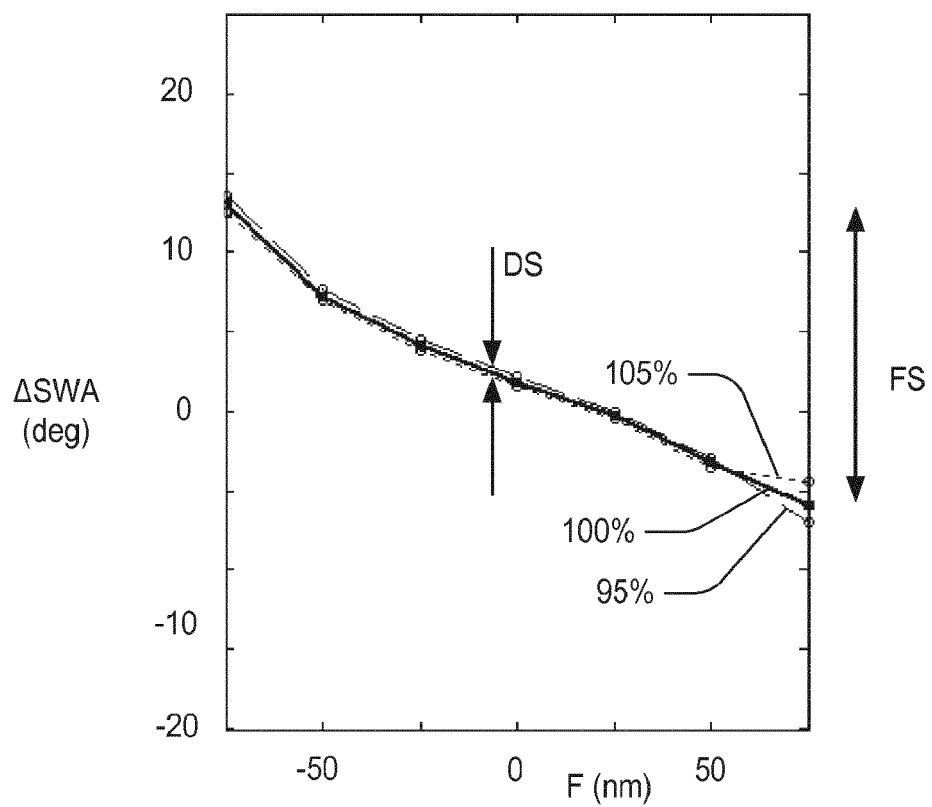

FIG. 8 is a graph that illustrates the dependence of side wall angle difference on focus setting for exposure of the grating pattern of FIG. 7.

Figure 9:
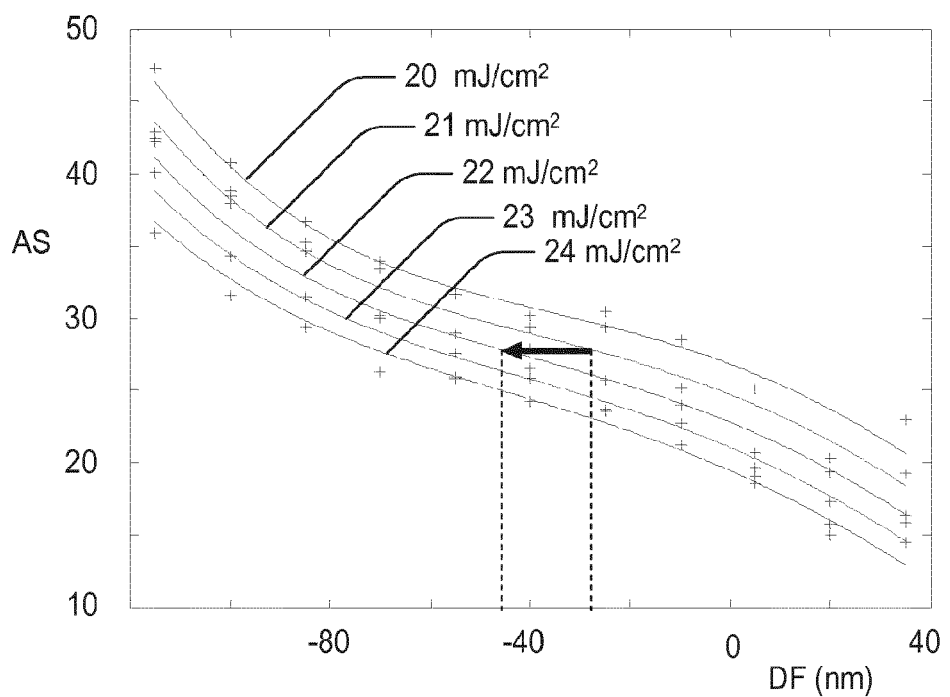

FIG. 9 is a graph of asymmetry, measured with a scatterometer, versus defocus of the lithographic apparatus for exposure of a grating pattern similar to that of FIG. 7.

Figure 10:
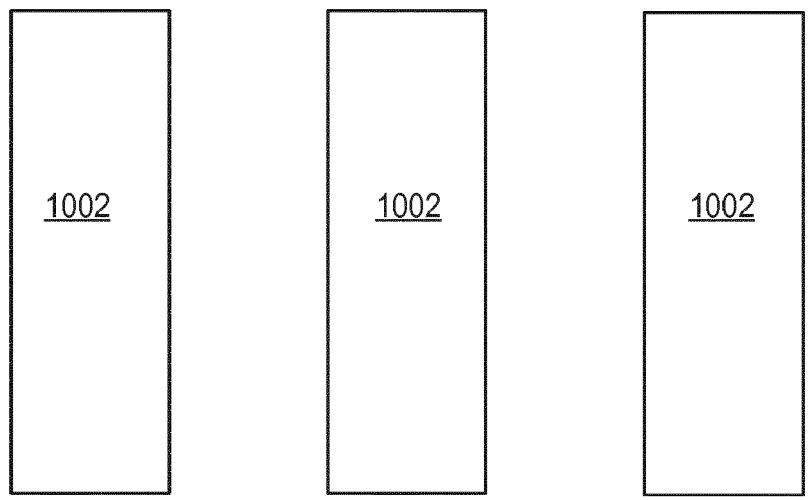

FIG. 10 illustrates a dose-sensitive symmetric grating pattern.

Figure 11:
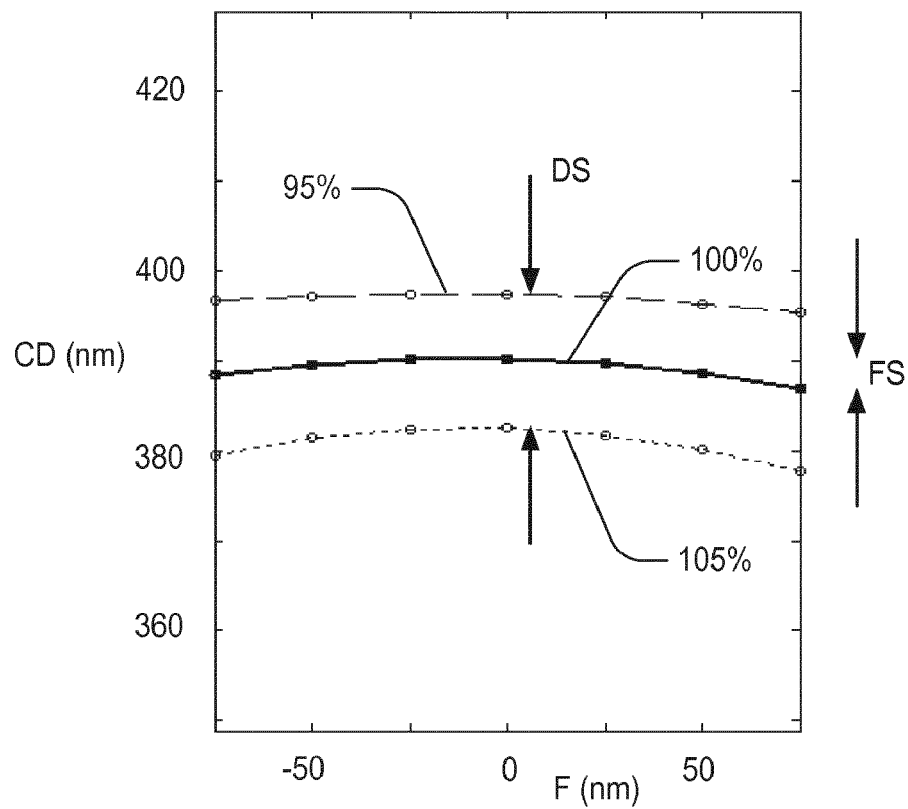

FIG. 11 is a graph that illustrates the dependence of critical dimension on focus setting of the lithographic apparatus for exposure of the grating pattern of FIG. 10.

Figure 12:
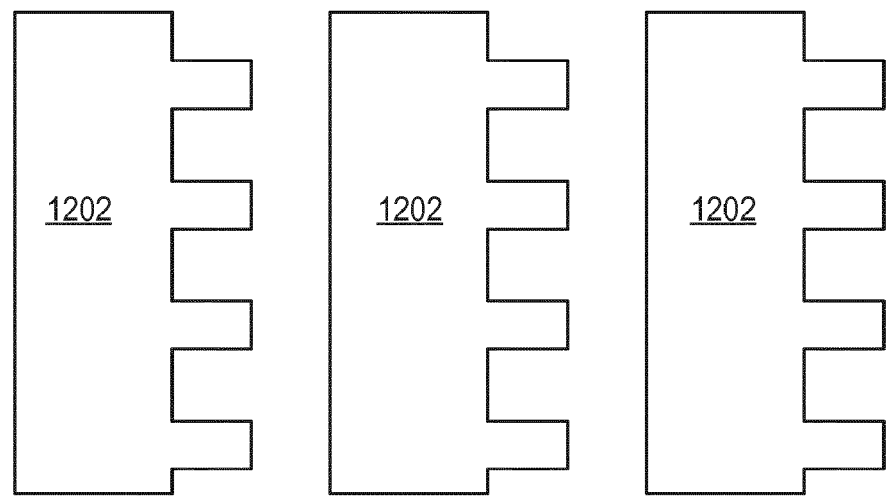

FIG. 12 illustrates a dose-sensitive asymmetric grating pattern.

Figure 13:
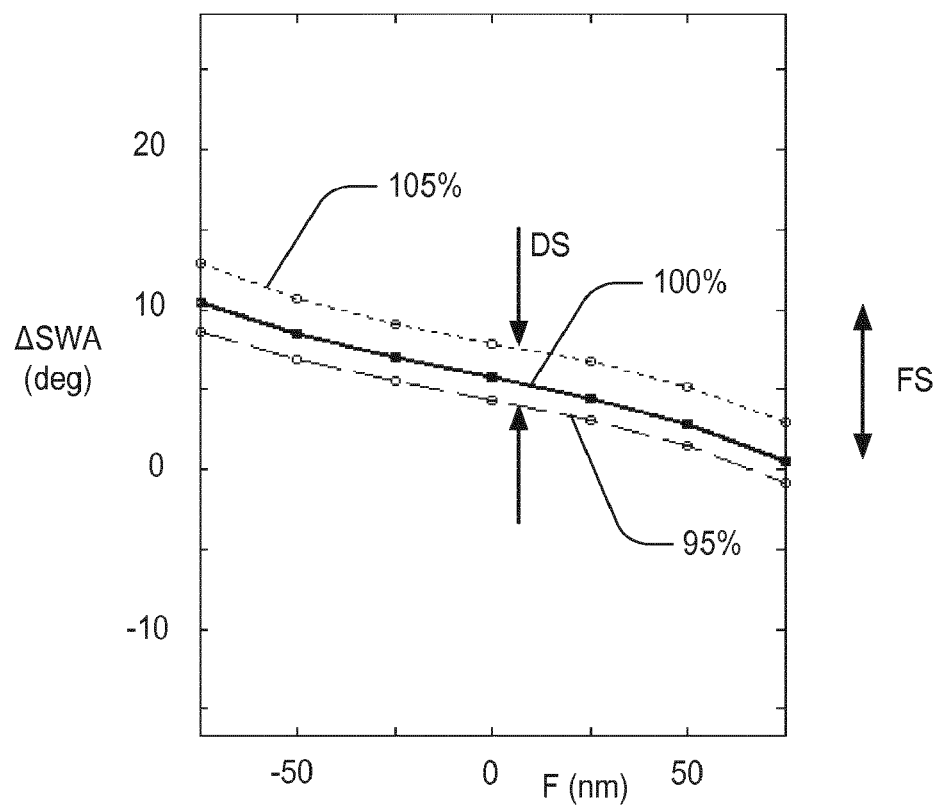

FIG. 13 is a graph that illustrates the dependence of side wall angle difference on focus setting of the lithographic apparatus for exposure of the grating pattern of FIG. 12.

Figure 14:
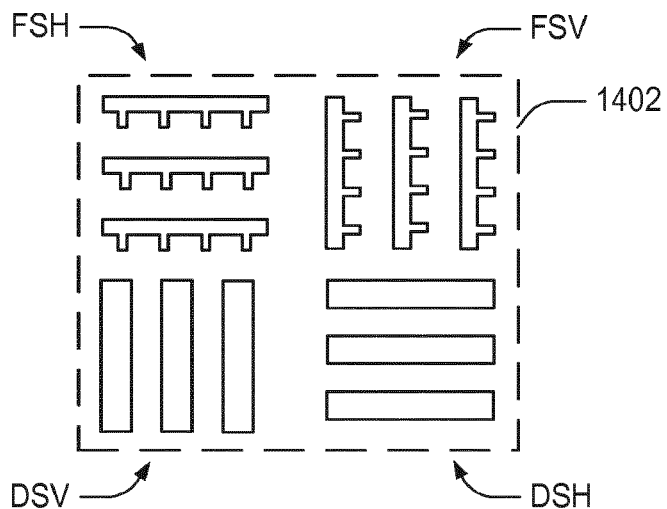
Figure 15:
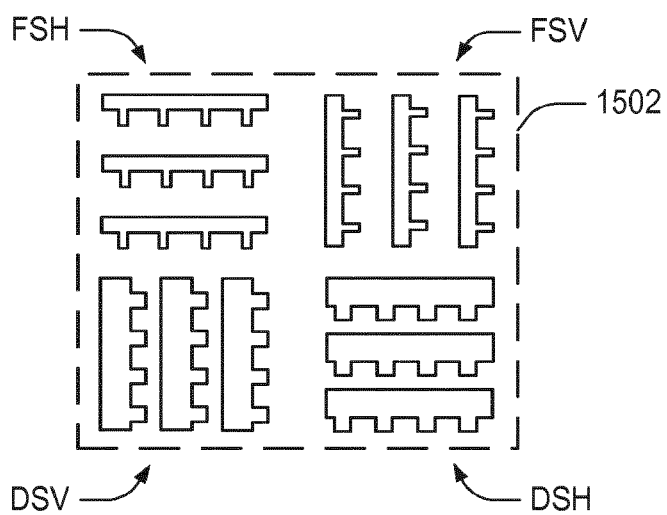

FIGS. 14 and 15 schematically illustrate combined focus- and dose-sensitive targets, suitable for dark-field image-detection scatterometry.

Figure 16:
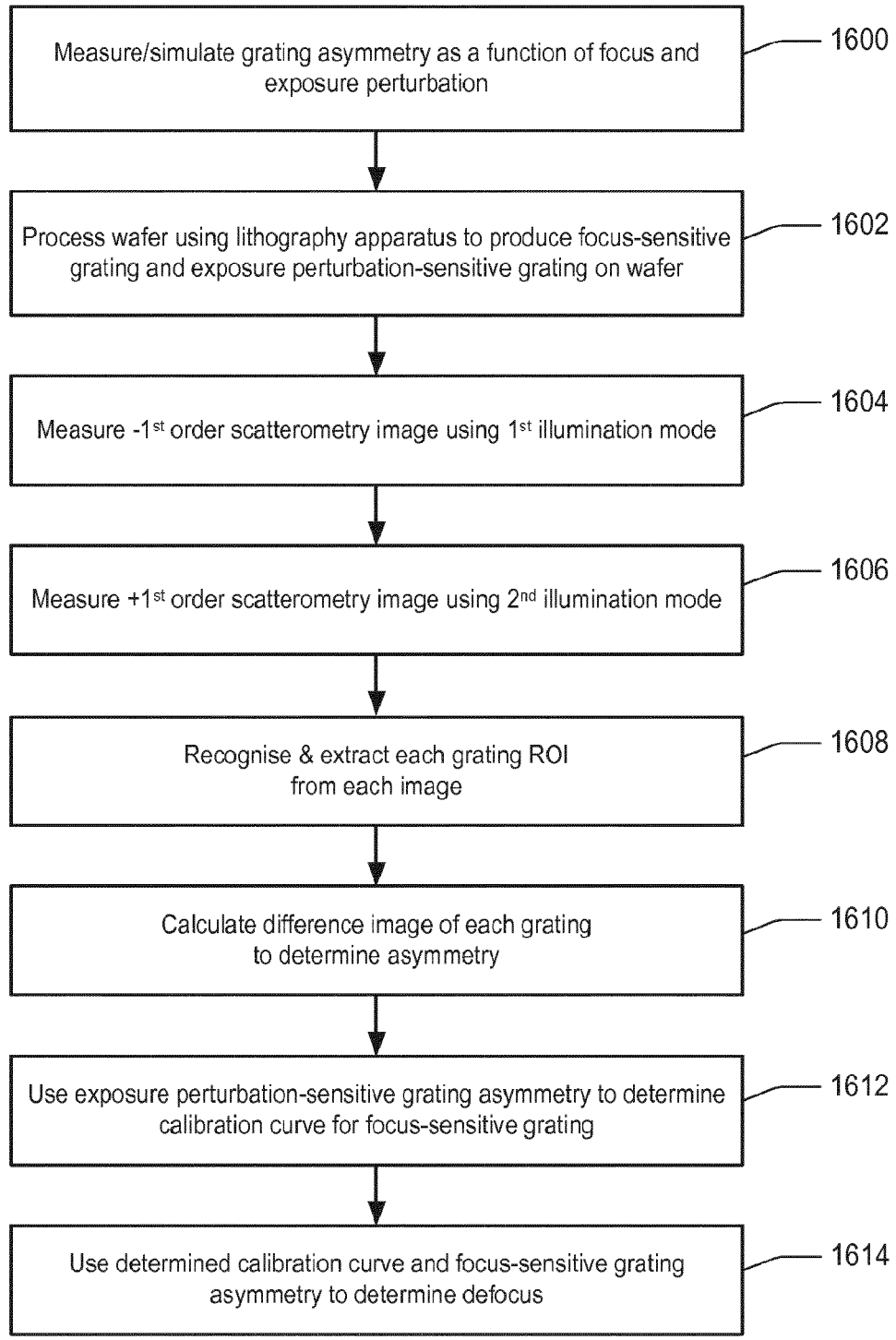

FIG. 16 is a flow chart of a method using measurement of an exposure perturbation-sensitive target and using dark-field scatterometry.

Figure 17:
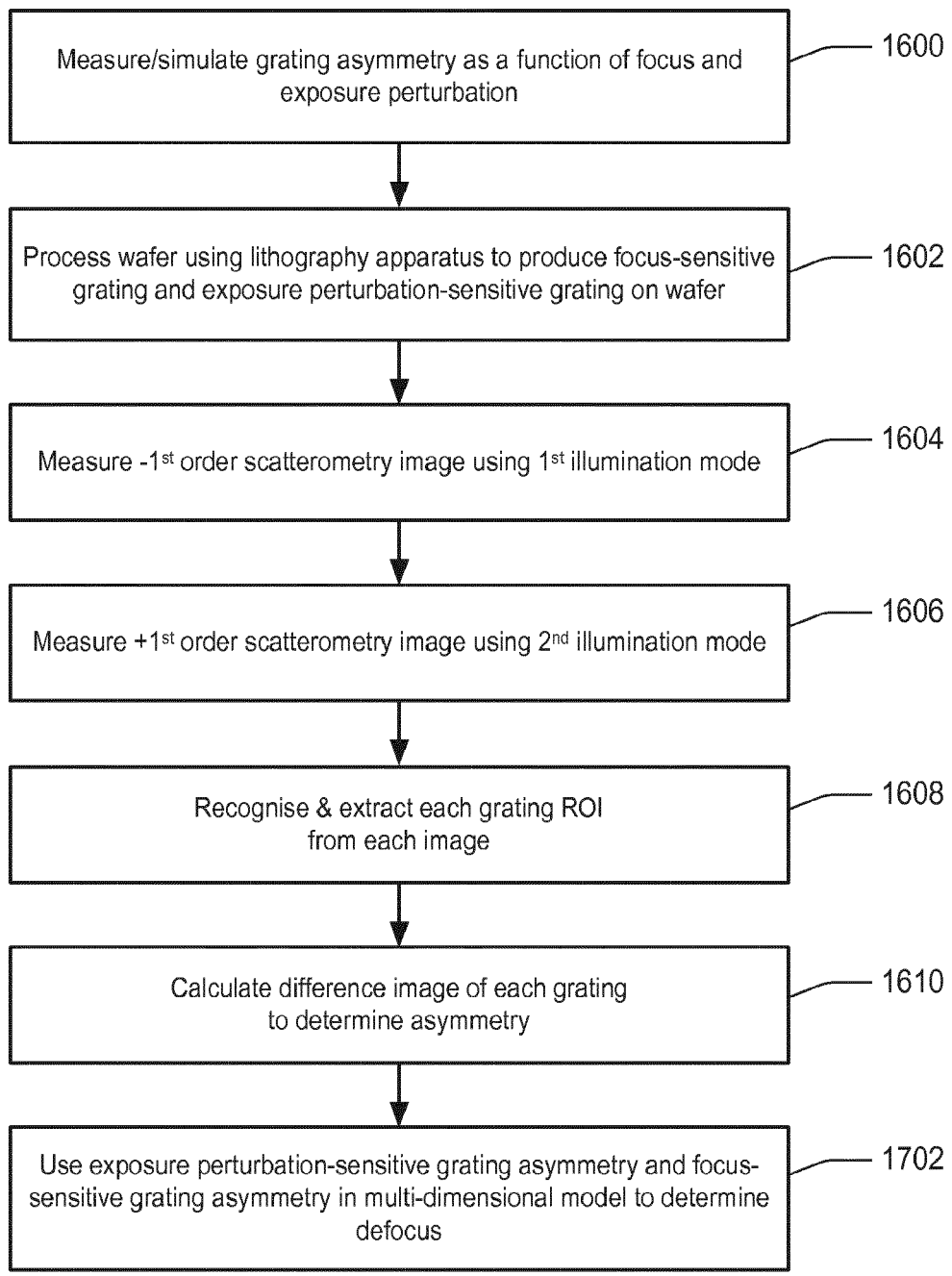

FIG. 17 is a flow chart of another method using measurement of an exposure perturbation-sensitive target and using dark-field scatterometry.

Figure 18:
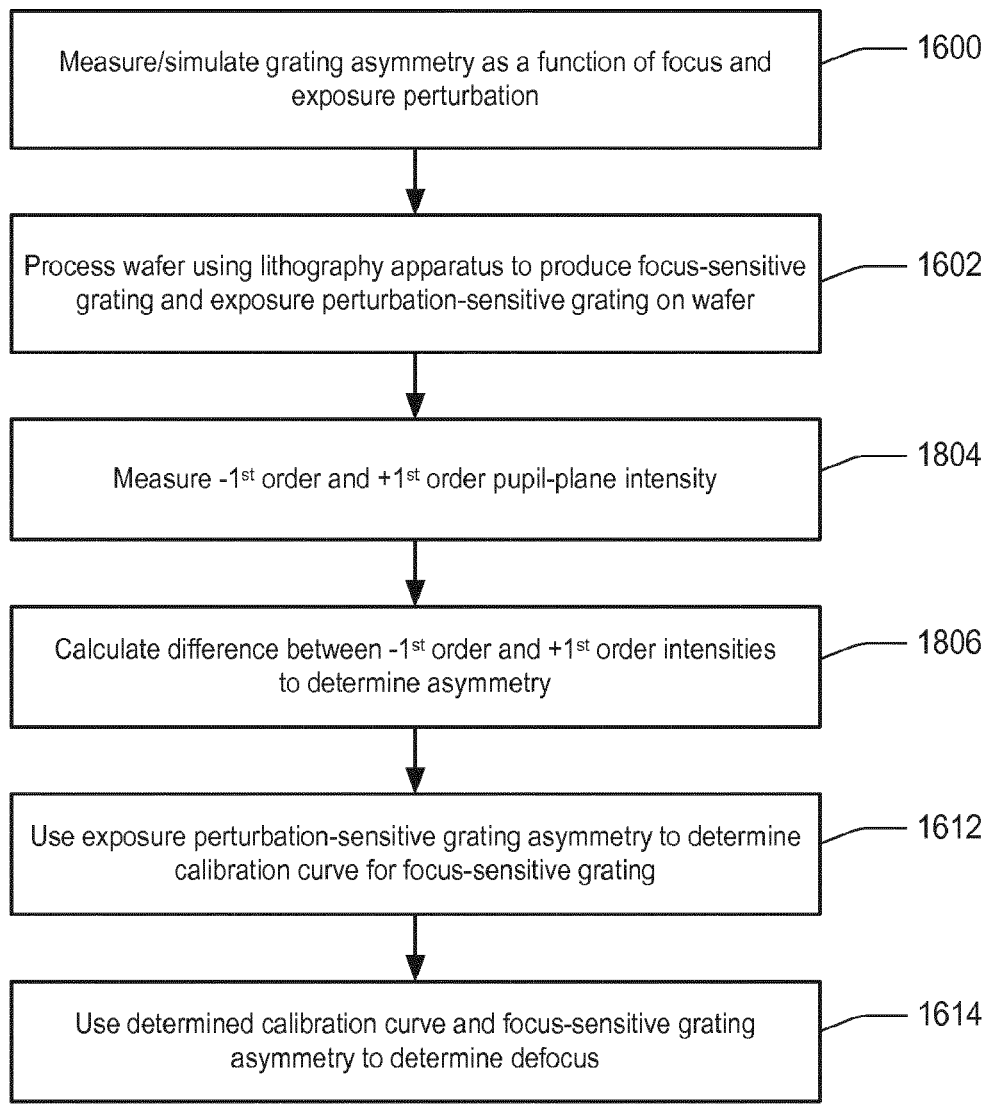

FIG. 18 is a flow chart of a method using measurement of an exposure perturbation-sensitive target and using pupil-plane detection scatterometry.

Figure 19:
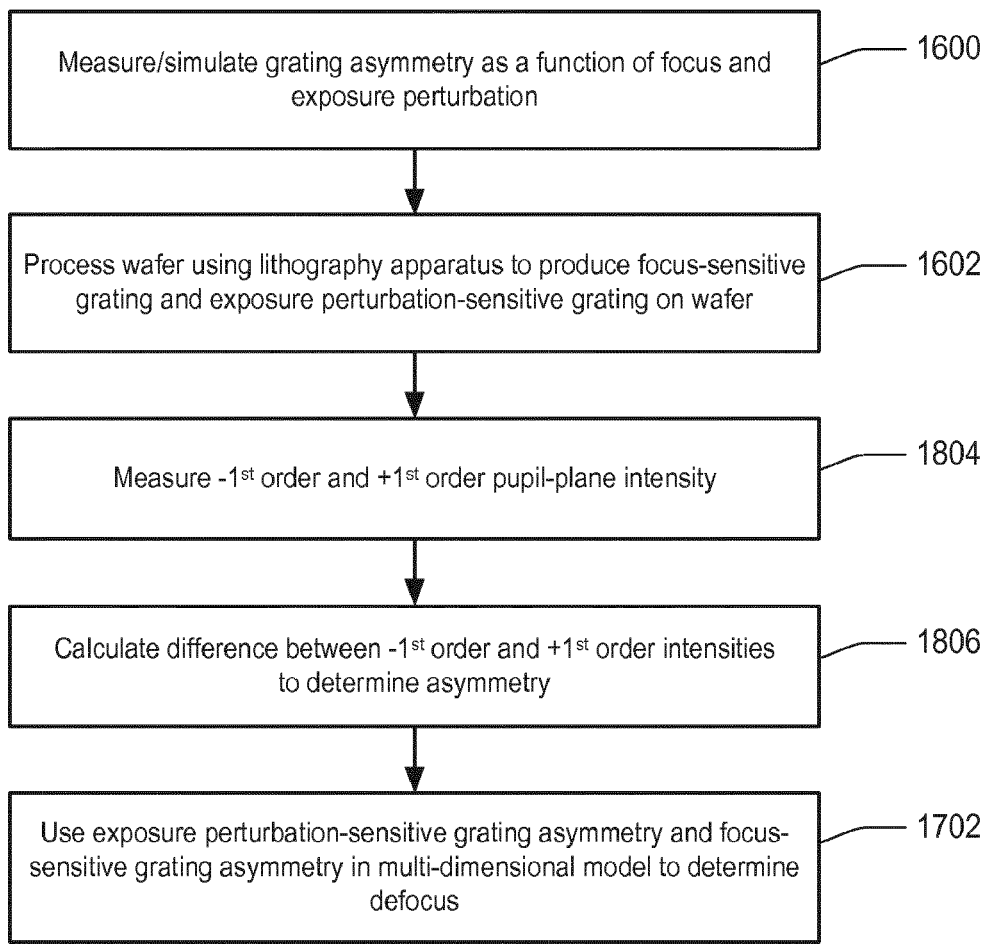

FIG. 19 is a flow chart of another method using measurement of an exposure perturbation-sensitive target and using pupil-plane detection scatterometry.

Figure 20:
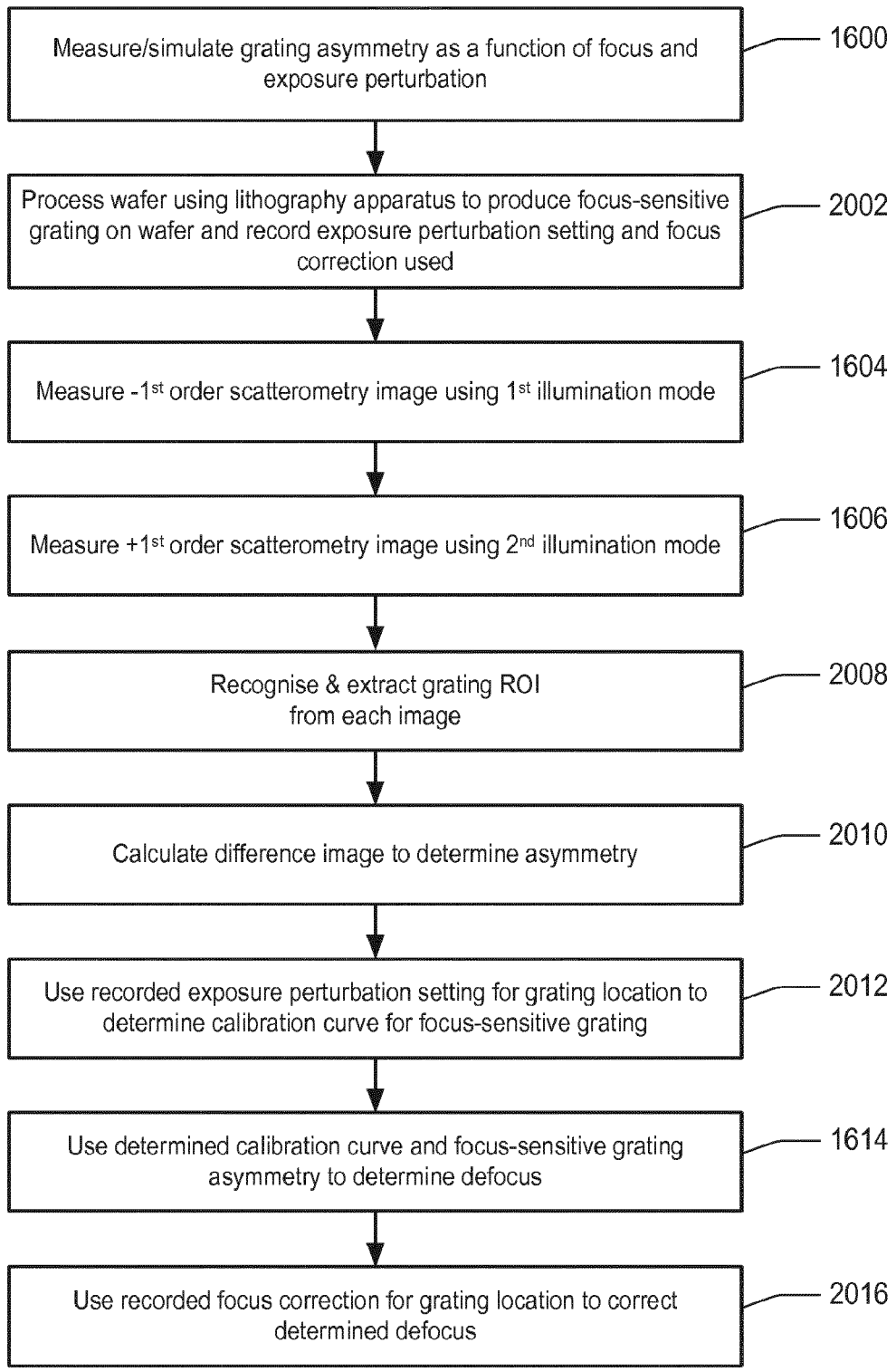

FIG. 20 is a flow chart of a method using recorded exposure perturbation settings and using dark-field scatterometry.

Figure 21:
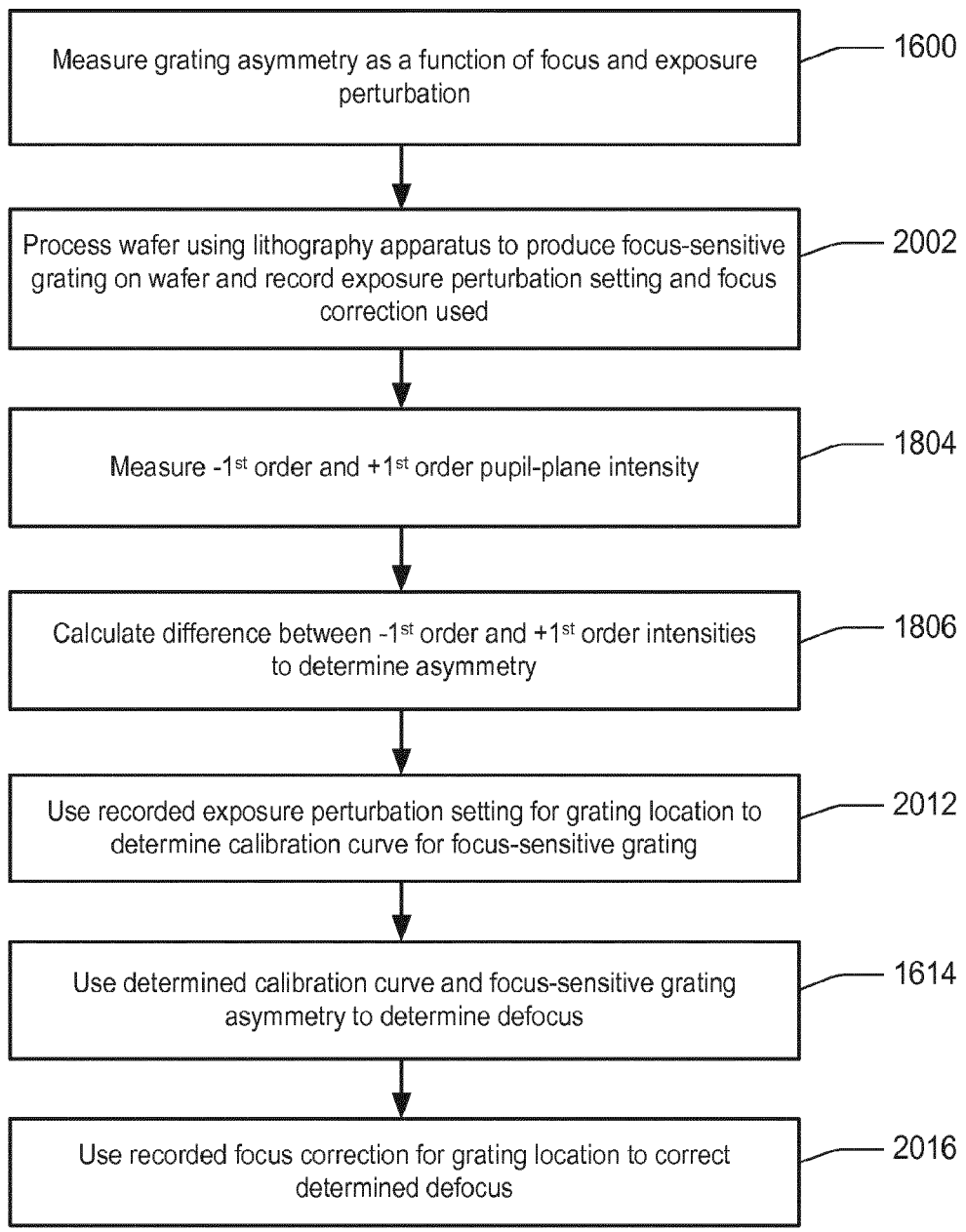

FIG. 21 is a flow chart of a method using recorded exposure perturbation settings and using pupil-plane detection scatterometry.

Figure 22:
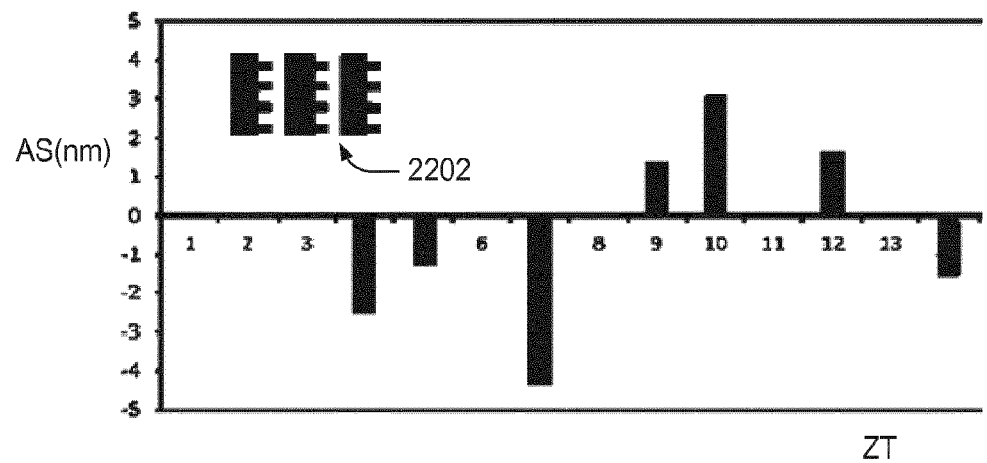

FIG. 22 is a graph of calculated aberration sensitivity of a typical focus-sensitive target, for a selection of Zernike terms.

Figure 23:
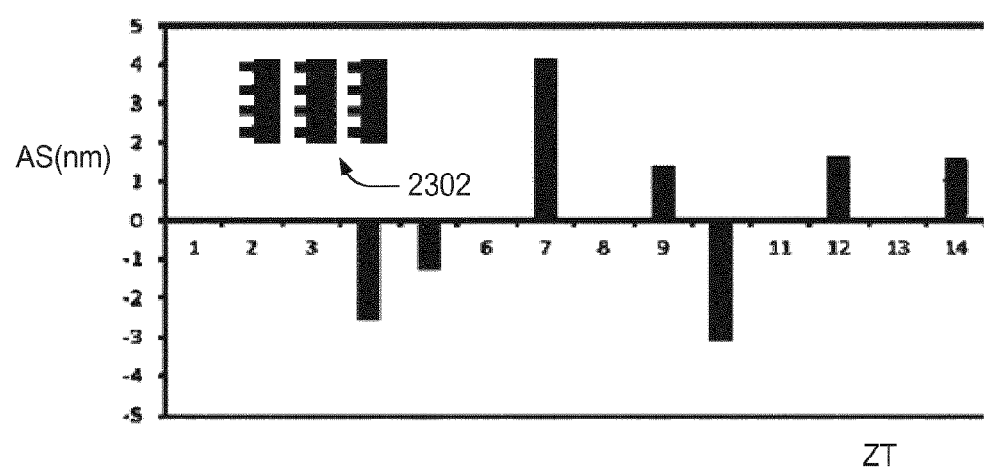

FIG. 23 is a graph of calculated aberration sensitivity of a focus-sensitive target being mirrored with respect to that of FIG. 22, for a selection of Zernike terms.

Figure 24:
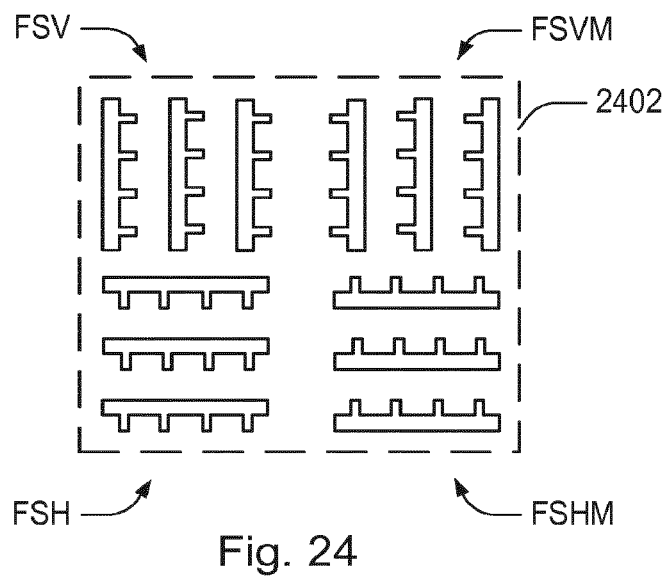

FIG. 24 schematically illustrates a combined focus- and aberration -sensitive target, suitable for dark-field image-detection scatterometry.

Figure 25:
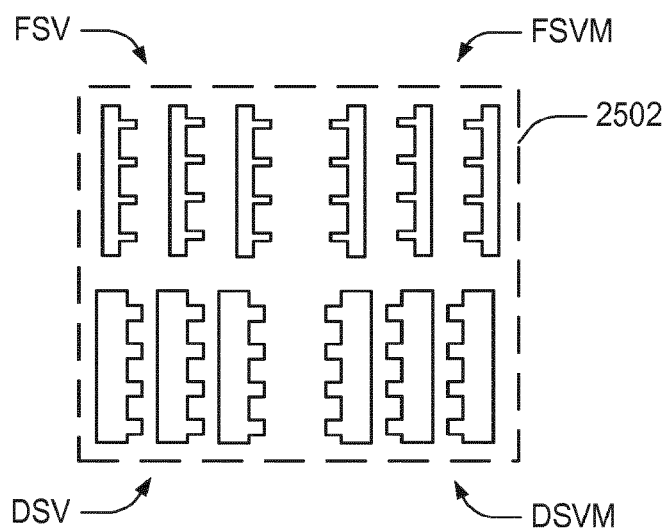

FIG. 25 schematically illustrates a combined focus-, aberration- and dose-sensitive target, suitable for dark-field image-detection scatterometry.

Figure 26:
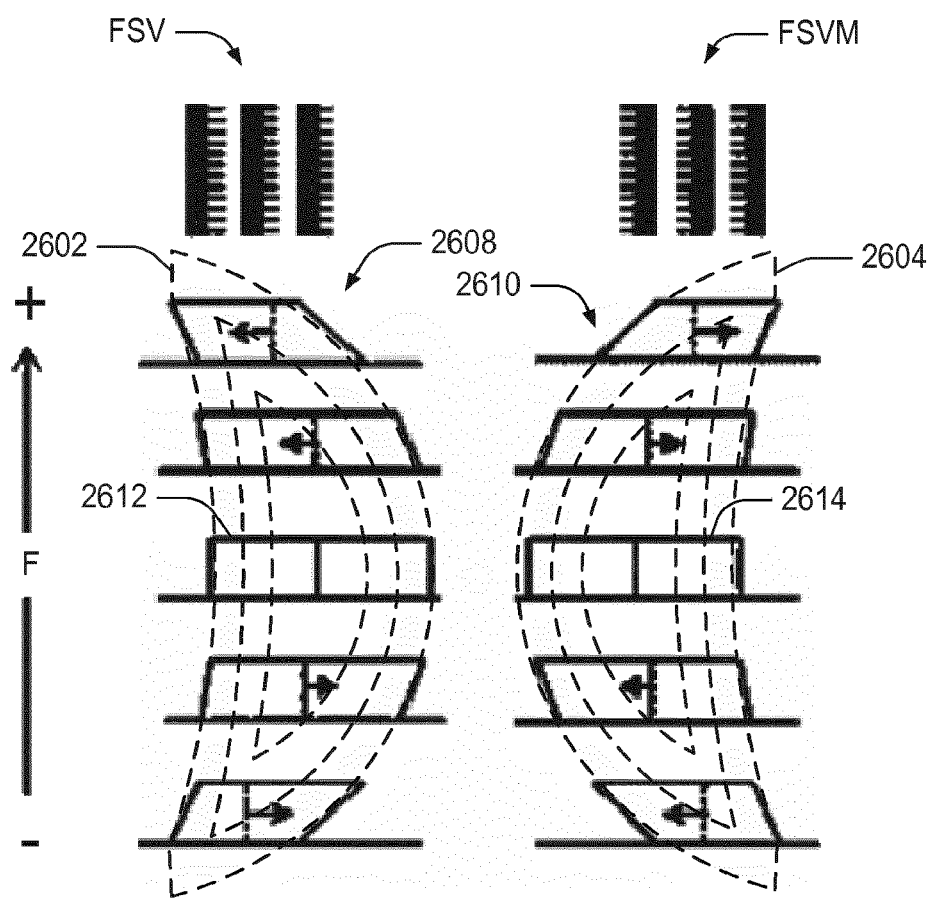

FIG. 26 schematically illustrates resist profile behavior of mirrored asymmetric targets as a function of focus.

Figure 27:
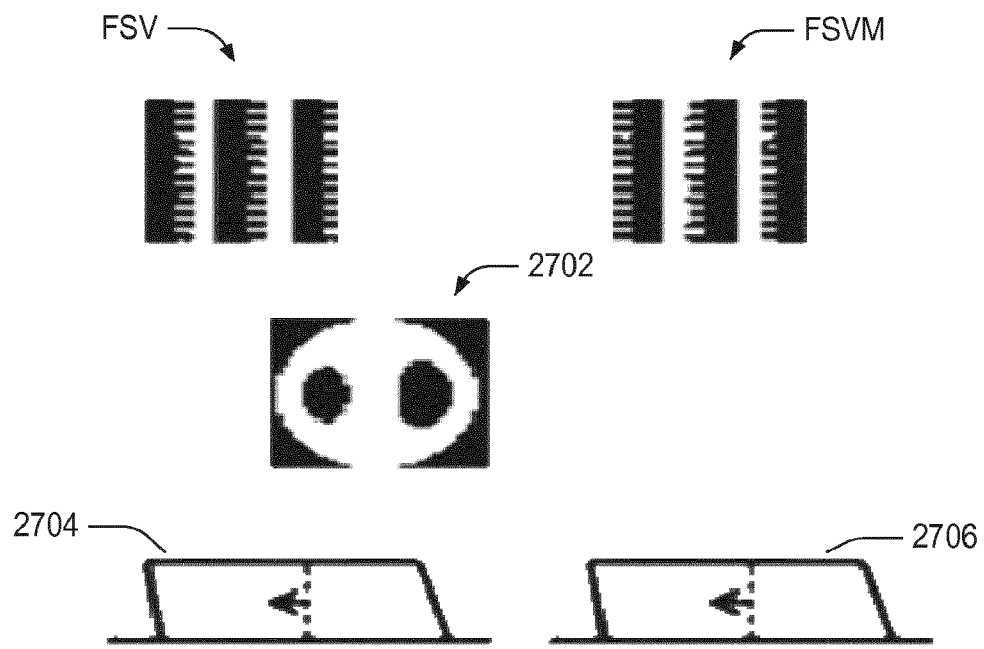

FIG. 27 schematically illustrates the impact on resist patterns of mirrored asymmetric targets resulting from odd Zernike terms arising from intra-field aberration variation.

Figure 28:
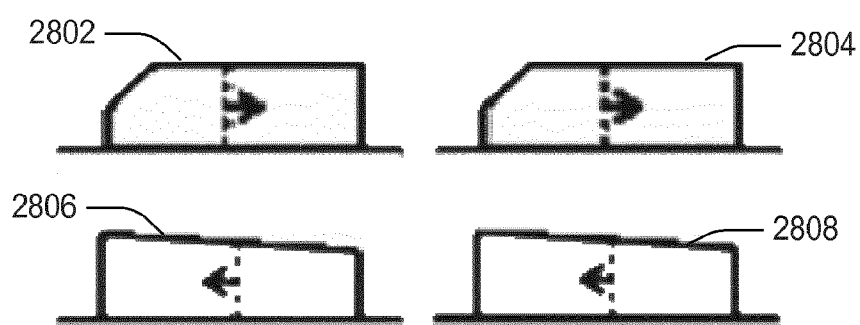

FIG. 28 schematically illustrates the impact on resist patterns of mirrored asymmetric targets resulting from inter-field process-induced variation.

Figure 29:
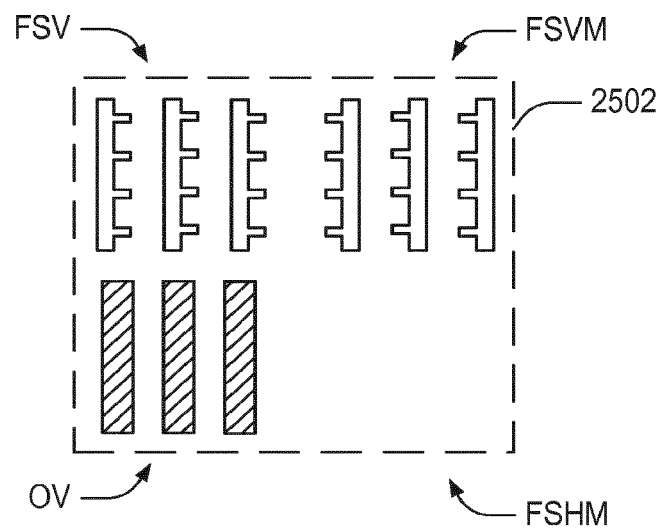

FIG. 29 schematically illustrates a combined focus-, aberration- and overlay-sensitive target, suitable for dark-field image-detection scatterometry.

Figure 30:
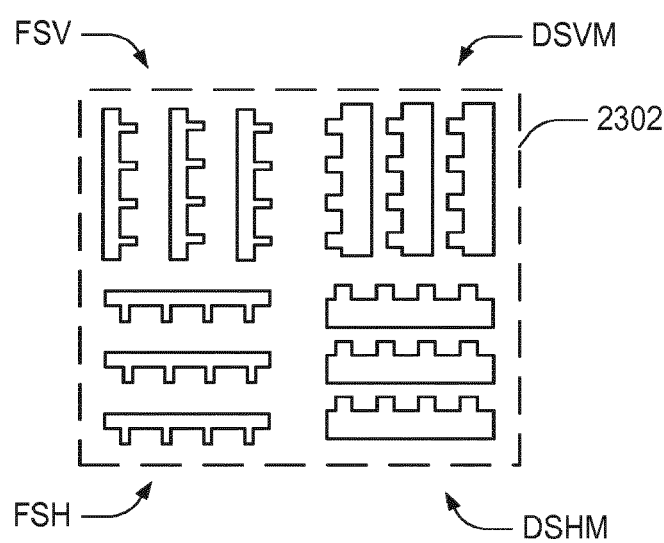

FIG. 30 schematically illustrates another combined focus-, aberration- and dose-sensitive target, suitable for dark-field image-detection scatterometry.

Figure 31:
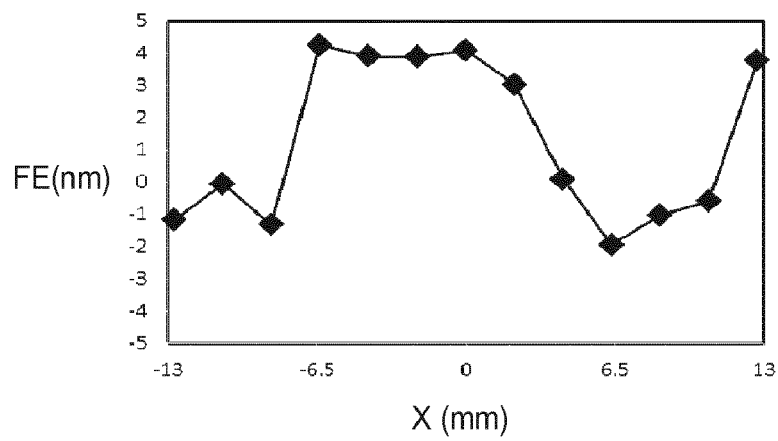
Figure 32:
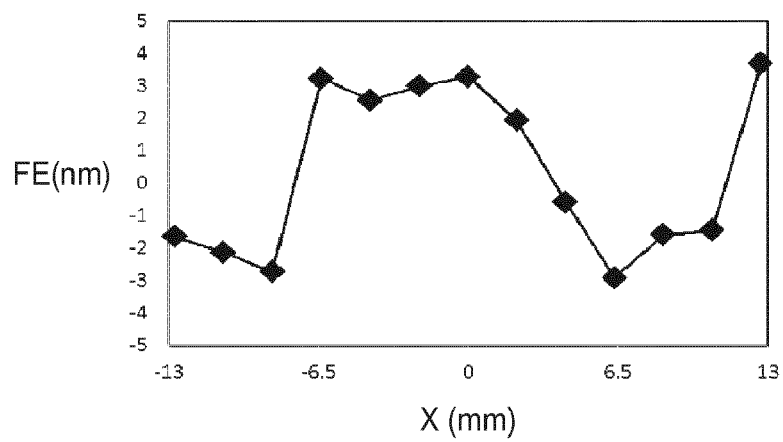

FIGS. 31 and 32 are graphs of aberration-induced asymmetry errors (summed for all aberrations; odd and even) for two different target designs.

Figure 33:
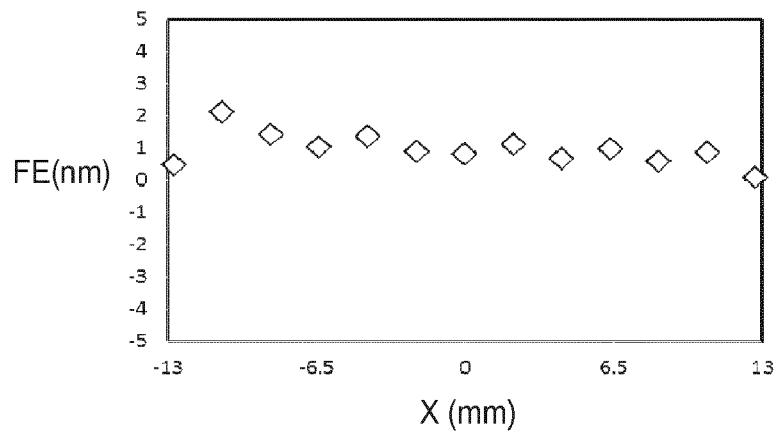

FIG. 33 is a graph of the difference between the aberration-induced asymmetry errors (summed for all aberrations; odd and even) shown in FIGS. 31 and 32.

Figure 34:
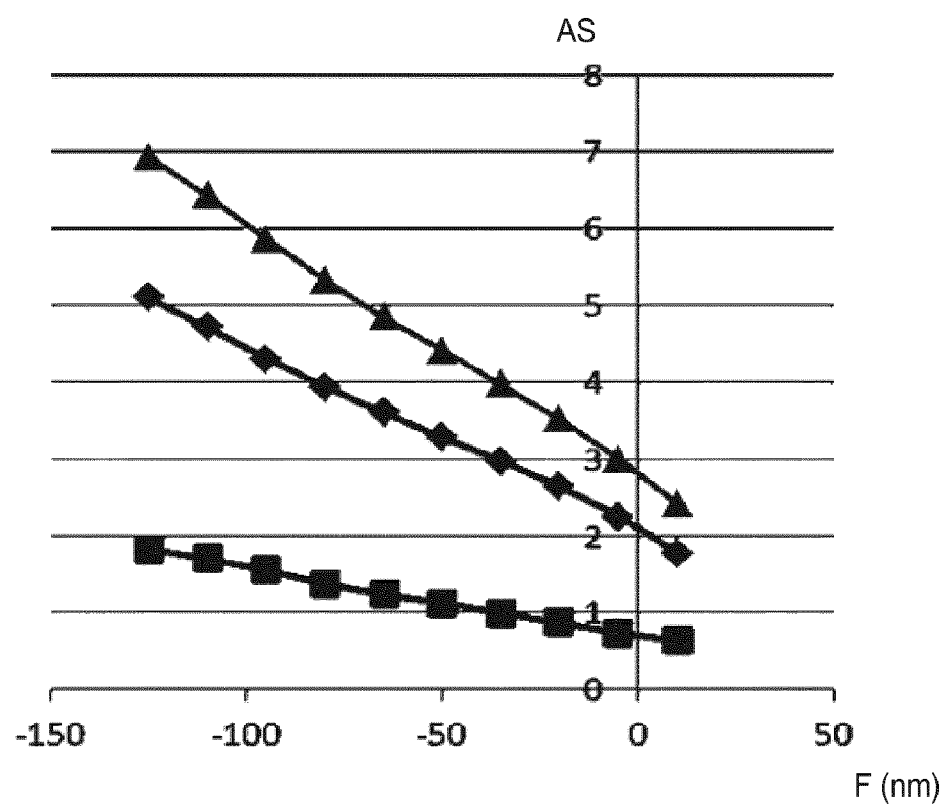

FIG. 34 is a graph of asymmetry versus focus for the targets corresponding to FIGS. 31, 32 and 33.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
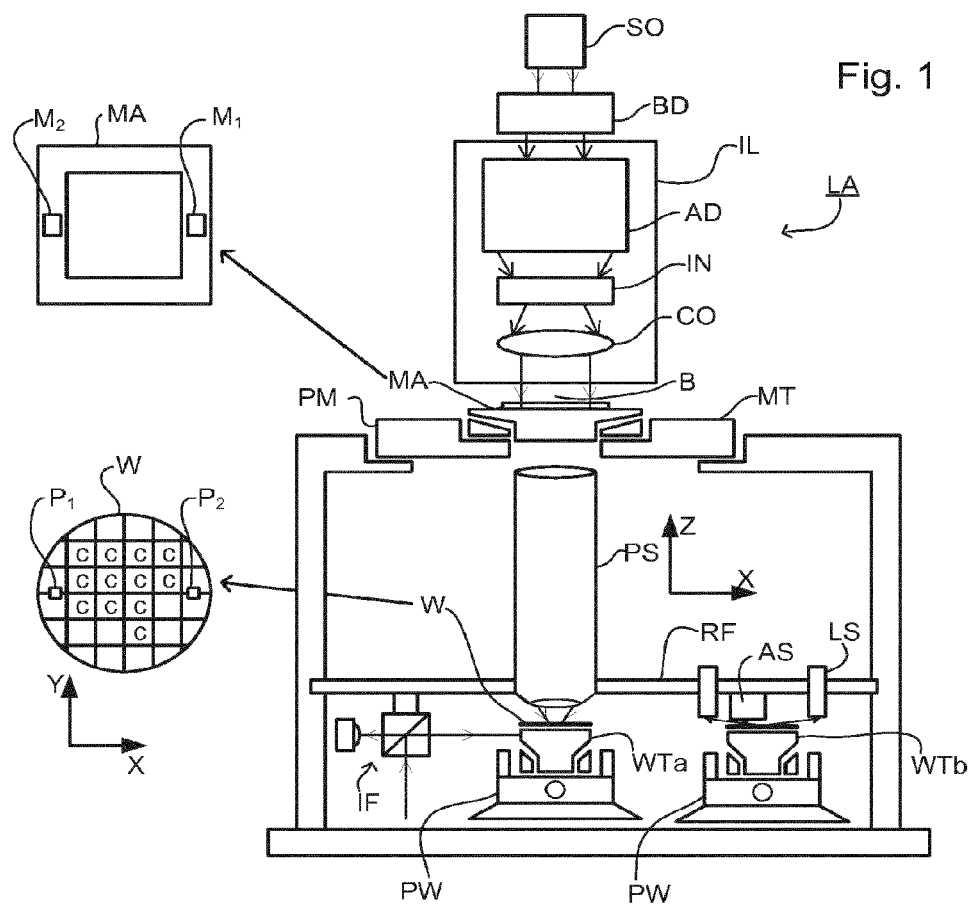
FIG. 1 depicts a lithographic apparatus according to an example of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
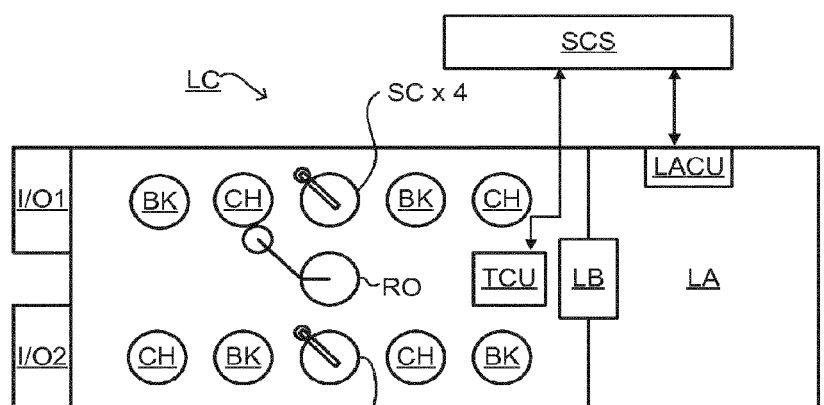
FIG. 2 depicts a lithographic cell or cluster according to an example of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

US patent publication number US20110249247A discloses using measured scatterometer signals from focus-sensitive asymmetric target designs to measure defocus of a lithographic apparatus. The contents of that application are incorporated herein by reference in its entirety. In such a method, asymmetric information, as available in the scatterometer pupil in the form of the difference between −1st and +1st diffraction order intensities, is used to infer scanner defocus from the measured scatterometer signals. Examples of dark-field metrology can be found in international patent applications WO 2009/078708 and WO 2009/106279, which documents are hereby incorporated by reference in their entirety. Further developments of the technique have been described in patent publications US20110027704A, US20110043791A and US20120123581A. The contents of all these applications are also incorporated herein by reference in their entireties.

A dark field metrology apparatus suitable for use in embodiments of the invention is shown in FIG. 3(a). A target grating T and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g., a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image for an underfilled target may be used as an input for focus metrology, in accordance with embodiments of the present invention.

In the second measurement branch, optical system 20, 22 forms an image of the target on the substrate W on sensor 23 (e.g., a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial sight modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In the present disclosure, therefore, there are effectively three types of measurement method, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that is likely to bring disadvantages for no advantage, so it will not be discussed further.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(c) and (d) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode.

FIG. 4 depicts a composite target formed on a substrate according to known practice. The composite target comprises four gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to defocus measurement, gratings 32 to 35 are themselves focus-sensitive gratings formed by asymmetric gratings that are patterned in layers of the semi-conductor device formed on substrate W. Gratings 32 to 35 may differ in their orientation, as shown, so as to diffract incoming radiation in X and Y directions. In one example, gratings 32 and 34 are X-direction gratings. Gratings 33 and 35 are Y-direction gratings. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. However the need for accurate alignment remains if the imaging process is subject to non-uniformities across the image field. In one embodiment of the invention, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process, such as focus.

FIG. 6 illustrates how, using for example the method described in application US20110027704A, incorporated by reference herein in its entirety, defocus is measured through asymmetry of one or more focus sensitive gratings, as revealed by comparing their intensities in the +1 order and −1 order dark-field images. At step S1, the substrate, for example a semiconductor wafer, is processed through the lithographic cell of FIG. 2 one or more times, to create a structure including the gratings. At S2, using the metrology apparatus of FIG. 3, an image of the gratings is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3).

Note that, by including only half of the first order diffracted radiation in each image, the 'images' referred to here are not conventional dark field microscopy images. The individual grating lines will not be resolved. Each grating will be represented simply by an area of a certain intensity level. In step S4, a region of interest (ROI) is carefully identified within the image of each component grating, from which intensity levels will be measured. This is done because, particularly around the edges of the individual grating images, intensity values can be highly dependent on process variables such as resist thickness, composition, line shape, as well as edge effects generally.

Having identified the ROI for each individual grating and measured its intensity, the asymmetry of the grating structure, and hence defocus, can then be determined. This is done by the image processor and controller PU in step S5 comparing the intensity values obtained for +1 and −1 orders for each grating 32-35 to identify any difference in their intensity, and (S6) to determine defocus in the vicinity of the target T.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the methods described herein and so calculate defocus with reduced sensitivity to exposure dose. The program may optionally be arranged to control the optical system, substrate support and the like to perform the steps for measurement of a suitable plurality of target structures.

FIG. 7 illustrates a focus-sensitive asymmetric grating pattern. In FIG. 7, a limited section of only three periods of the grating is shown. In the full grating, the pattern 702 repeats in the vertical and horizontal directions. The pattern 702 may be for example a chrome pattern on a reticle. When the pattern 702 of FIG. 7 is used in a lithographic apparatus to produce a focus-sensitive grating structure on a wafer, the smaller horizontal projections may or may not be resolved, but give a profile with a difference between the right and left side of each printed line (i.e., asymmetry) that is dependent on the focus. A difference in side wall angle is one example of such asymmetry. This sidewall angle dependence on focus of the right side is much greater than for the left side that has no projections. The pattern 702 therefore leads to a difference in asymmetry, such as printed side wall angle, ΔSWA, between the left and right side of each line, which is dependent on focus of the lithographic apparatus during exposure of the grating pattern.

Dose Perturbations

FIG. 8 is a graph that illustrates the dependence of side wall angle difference, ΔSWA, in degrees, on focus setting, F, in nm, of the lithographic apparatus using exposure of the grating pattern of FIG. 7. The black curve, labeled 100%, represents a 100% exposure dose. A rough measure of SWA focus sensitivity, FS, is shown and indicates the range of ΔSWA as focus is varied. Two more curves are shown, for each of 95% and 105% dose. The different doses are shifted down and up respectively from the 100% dose curve. This dose sensitivity, DS, is shown and indicates the range of ΔSWA as dose is varied. Although the focus and dose sensitivities have different units and so must be compared with caution, for the grating pattern of FIG. 7, the focus sensitivity, FS, over the selected range of focus, −75 to +75 nm, seems much greater than the dose sensitivity, DS, over the selected range of dose, 95% to 105%. However, the dose sensitivity is still enough to cause a problem with accuracy of the focus measurement using asymmetry. This problem is illustrated in FIG. 9.

FIG. 9 is a graph of asymmetry, AS, measured with a scatterometer versus defocus, DF, in nm, of the lithographic apparatus using exposure of a grating pattern similar to that of FIG. 7. Five doses are shown, labeled with the doses 20 to 24 $mJ/cm^2$ respectively. Thus FIG. 9 shows the measured asymmetry curves as a function of focus and dose. Using the asymmetric information from the asymmetric focus target suffers from a dose cross-talk effect, indicated with the black arrow. In this example, if dose changes by 1 $mJ/cm^2$ (~5%) from 21 to 22 $mJ/cm^2$ as shown by the arrow, then the cross-talk (focus error) is ~20 nm, as shown by the dashed lines. Examples described herein use knowledge of exposure dose used to produce the focus-sensitive structure to decouple the impact of dose cross-talk terms from the actual lithographic apparatus defocus value measured using an asymmetric focus-sensitive grating, such as that shown in FIG. 7. In examples described herein, the knowledge can come from scatterometry measurement of dose-sensitive structure, as described with reference to FIGS. 10 to 19. In other examples, the knowledge can come from recorded exposure dose settings of the lithographic apparatus, as described with reference to FIGS. 20 and 21. Although the examples are described with reference to separate figures, the knowledge of exposure dose can come from a combination of scatterometry measurement of dose-sensitive structure and recorded exposure dose settings of the lithographic apparatus. In addition or alternatively, other sources of knowledge of the exposure dose used to produce the focus-sensitive structure may also be used.

FIG. 10 illustrates a dose-sensitive symmetric grating pattern. In FIG. 10, as for FIG. 7, a limited section of only three periods of the grating is shown. In the full grating, the pattern 1002 of FIG. 10 grating repeats in the vertical and horizontal directions. The pattern 1002 may be for example a chrome pattern on a reticle.

When the pattern of FIG. 10 is used in a lithographic apparatus to produce a dose-sensitive grating structure on a wafer, the structure has a profile with a sidewall angle at both the left and right sides of each printed line that is equally dependent on the focus. The pattern 1002 leads to a linewidth, or critical dimension, CD, that is dependent on the focus. However, the CD is more dependent on the dose. This is illustrated by FIG. 11.

FIG. 11 is a graph that illustrates the dependence of critical dimension, CD, on focus setting, F, in nm, of the lithographic apparatus using exposure of the grating pattern of FIG. 10. The black curve, labeled 100%, represents a 100% exposure dose. A rough measure of CD focus sensitivity, FS, is shown and indicates the range of CD as focus is varied. Two more curves are shown, for each of 95% and 105% dose. The different doses are shifted up and down respectively from the 100% dose curve. This dose sensitivity, DS, is shown and indicates the range of CD as dose is varied. Compared to the printed grating resulting from the pattern 702 of FIG. 7, the printed grating resulting from pattern 1002 of FIG. 10 has a form that is differently sensitive (in this example, less sensitive) to focus of the lithographic apparatus, but is differently sensitive (in this example, more sensitive) to exposure dose of the lithographic apparatus. Other examples may have differently sensitivity that is not less sensitive to focus and more sensitive to exposure dose. For example, two (or more) different target gratings may be measured with two (or more) different scatterometer wavelengths. The obtained scatterometer signals are not directly comparable (for example because "sensitivity" depends on the properties of the stack of materials used to produce the target grating), however it is possible to simply use the combination of the two (or more) scatterometer signals to find the optimal solution. Furthermore, for combinations of symmetric and asymmetric gratings, the signals or different in origin. As such sensitivity values again cannot be compared directly, but it is again possible to simply use the combination of signals to find the optimal solution.

FIG. 12 illustrates a dose-sensitive asymmetric grating pattern. In FIG. 12, a limited section of only three periods of the grating is shown. In the full grating, the pattern 1202 of FIG. 12 grating repeats in the vertical and horizontal directions. The pattern 1202 may be for example a chrome pattern on a reticle. When the pattern of FIG. 12 is used in a lithographic apparatus to produce a dose-sensitive grating structure on a wafer, the smaller horizontal projections are not resolved, but give a profile with a sidewall angle at the right side of each printed line that is dependent on the focus. This sidewall angle dependence on focus of the right side is greater than for the left side that has no projections. The pattern 1202 leads to a difference in printed grating side wall angle, $\Delta$SWA, between the left and right side of each line, that is dependent on focus of the lithographic apparatus during exposure of the grating pattern, but which is less sensitive to focus than for a grating printed by the pattern 702 of FIG. 7. Being more dose sensitive than the pattern 702 of FIG. 7, and having a dose sensitivity closer to the pattern 1002 of FIG. 10, the pattern 1202 leads to a printed grating with a form that is more sensitive to the exposure dose of the lithographic apparatus compared to the grating resulting from the pattern 702. This is illustrated by FIG. 13.

FIG. 13 is a graph that illustrates the dependence of side wall angle difference, $\Delta$SWA, in degrees, on focus setting, F, in nm, of the lithographic apparatus using exposure of the grating pattern of FIG. 12. The black curve, labeled 100%, represents a 100% exposure dose. A rough measure of SWA focus sensitivity, FS, is shown and indicates the range of $\Delta$SWA as focus is varied. Two more curves are shown, for each of 95% and 105% dose. The different doses are shifted down and up respectively from the 100% dose curve. This dose sensitivity, DS, is shown and indicates the range of $\Delta$SWA as dose is varied. As for FIGS. 10 and 11, compared to the printed grating resulting from the pattern 702 of FIG. 7, the printed grating resulting from pattern 1202 of FIG. 12 has a form that is less sensitive to focus of the lithographic apparatus, but is more sensitive to exposure dose of the lithographic apparatus.

FIG. 14 schematically illustrates a combined focus- and dose-sensitive target 1402, suitable for dark-field image-detection scatterometry. Combined targets have an advantage of reducing the effect of metrology perturbations. Although only three periods of each grating are shown, this is only to represent the type of grating. The patterns are not to scale and in practice will be smaller and repeated in the vertical and horizontal directions. The gratings labeled FSH and FSV are focus-sensitive asymmetric gratings, as described with reference to FIG. 7, with lines in horizontal and vertical directions respectively. The gratings labeled DSH and DSV are dose-sensitive gratings, as described with reference to FIG. 10, with lines in horizontal and vertical directions respectively.

FIG. 15 schematically illustrates a combined focus- and dose-sensitive target 1502, suitable for dark-field image-detection scatterometry. As for FIG. 14, although only three periods of each grating are shown, this is only to represent the type of grating. The gratings labeled FSH and FSV are again focus-sensitive asymmetric gratings, as described with reference to FIG. 7, with lines in horizontal and vertical directions respectively. The gratings labeled DSH and DSV are dose-sensitive gratings as described with reference to FIG. 12, with lines in horizontal and vertical directions respectively.

FIG. 16 is a flow chart of a method using measurement of an exposure perturbation-sensitive target in accordance with an embodiment of the present invention, using dark-field scatterometry. The following description of FIG. 16 has dose as the exposure perturbation and uses a target as illustrated in FIG. 15. Other examples of exposure perturbations of the lithographic apparatus are aberration and illumination conditions, for which other targets may be used, such as those illustrated in FIGS. 24 and 25. For FIGS. 16 and 17, only the horizontal gratings will be mentioned, although the vertical gratings may also be used, in order to separately measure X and Y focus behavior. The steps are:

In step 1600: Measure the grating asymmetry as a function of focus and dose. The results of such measurements are shown in the graph of FIG. 9.

In step 1602: Process a wafer using lithographic apparatus to produce a focus-sensitive grating, FSH, and dose-sensitive grating, DSH, on the wafer.

In step 1604: Measure −1st order scatterometry image using a 1st illumination mode.

In step 1606: Measure +1st order scatterometry image using a 2nd illumination mode.

In step 1608: Recognize & extract each grating region of interest (ROI) from each image.

In step 1610: Calculate a difference (between −1st and +1st order measurements) image of each grating to determine asymmetry.

In step 1612: Use the dose-sensitive grating, DSH, asymmetry to determine which calibration curve to select (such as shown in FIG. 9) for the focus-sensitive grating, FSH.

In step 1614: Use the determined calibration curve and focus-sensitive grating, FSH, asymmetry to determine defocus.

FIG. 17 is a flow chart of a method in accordance with another embodiment of the present invention, using dark-field scatterometry. The following description of FIG. 17 has dose as the exposure perturbation and uses a target as illustrated in FIG. 15, but uses the grating asymmetries differently to determine focus. Other examples of exposure perturbations of the lithographic apparatus are aberration and illumination conditions, for which other targets may be used, such as those illustrated in FIGS. 24 and 25. Other examples of exposure perturbations of the lithographic apparatus are general scanner contrast terms. Other examples of exposure perturbations of the lithographic apparatus are moving standard deviations. The term 'moving standard deviation' or MSD has been adopted for dynamic errors described as follows.

Errors in the various servo systems and components of a lithographic apparatus, which inevitably occur during exposure or printing of a pattern on a substrate, give rise to errors in the quality of the applied pattern, relative to the ideal pattern. These quality reductions are typically expressed through their impact on alignment (position in the substrate plane) and/or in the critical dimension (CD) and CD uniformity (CDU) in the product pattern. Error sources can be relatively static, or they can be dynamic—for example vibrations or wobbles relative to a desired path. As other error sources are reduced with every node and new lithographic platform, the relative impact of these dynamic errors variations is becoming a significant performance-limiting factor. Also, efforts to increase throughput of the apparatus often imply components move and accelerate/decelerate faster, while being lighter and therefore less stiff in construction. These measures tend to increase dynamic errors if not mitigated by careful design. These MSD errors are cross-talk terms that affect focus measurement.

The steps 1600 to 1610 are the same as described with reference to FIG. 16 (for the dose exposure perturbation example), followed by the step:

In step 1702: Use the dose-sensitive grating asymmetry, DSH, and focus-sensitive grating, FSH, asymmetry in multi-dimensional model to determine defocus.

Thus in some embodiments of the present invention, it is proposed to use information of another scatterometer target to decouple the impact of cross-talk terms from the actual scanner defocus value, as measured on the original target. This may be done in the following ways:

1. Use symmetric information from a dose-sensitive symmetric target, e.g., produced using pattern 1002 in FIG. 10, as input for setting the correct dose value for the inference curve of a focus-sensitive asymmetric target, e.g., produced using pattern 702 in FIG. 7. The symmetric information may be, for example, CD obtained from reconstruction using an underfilled target measured with pupil plane detection scatterometry. The symmetric information may be, for example, mean intensity over the region of interest obtained by dark field detection scatterometry using a smaller overfilled in-die target.

2. Use asymmetric information, e.g., scatterometer asymmetry, from a dose-sensitive asymmetric target, e.g., produced using pattern 1202 in FIG. 12, as input for setting the correct dose value for the inference curve of the focus-sensitive asymmetric target, e.g., produced using pattern 702 in FIG. 7.

The information from both asymmetric and symmetric dose-sensitive targets can be used in the following ways:

a) In a feed-forward type application, use information from a dose-sensitive target to feed as input for selecting the correct calibration curve of the focus target, as described with reference to FIG. 16, and, if desired, repeat this iteratively.

b) In a joint optimization scheme, use signals of both targets, e.g., produced using pattern 702 in FIG. 7, and e.g., produced using pattern 1202 in FIG. 12 or 1002 in FIG. 10, to create a multidimensional model to infer focus and dose information.

As described with reference to FIGS. 14 and 15, the focus-sensitive and dose-sensitive gratings do not have to be physically apart. They can be one physical target. A detection method such as described with reference to FIG. 16 allows separation of dose-sensitive and focus-sensitive information with one pass of the inspection apparatus. These targets may also be combined on a single location on the wafer, for example by orthogonal placement of both target structure types (dose sensitive target in horizontal direction; focus sensitive targets in vertical direction). This is suitable for pupil-plane detection scatterometry mode.

For item 2 above (using asymmetric information from a dose-sensitive asymmetric target), the principle of asymmetric scatterometer signal detection can be used to decouple stack information from grating information, as is also the main advantage for the asymmetric focus targets. For item 1 (using symmetric information from a dose-sensitive symmetric target), this is not the case, and to first calculate CD from scatterometry signals, a full reconstruction cycle may be needed, or a CD measurement of the dose sensitive symmetric or asymmetric target with another metrology method such as CD-SEM (Scanning Electron Microscopy), before deducing dose information from the measured targets.

Pupil-plane detection scatterometry may also be used, as illustrated by FIGS. 18 and 19 alone as an alternative to or in combination with dark-field image-detection scatterometry (as described for FIGS. 6, 16 and 17) to obtain the scatterometry signals, for use according to embodiments of the present invention.

FIG. 18 is a flow chart of a method in accordance with an embodiment of the present invention using pupil-plane detection scatterometry. The following description of FIG. 18 has dose as the exposure perturbation and may use underfilled targets as illustrated in FIGS. 7 and 12. The steps

1600, 1602, 1612 and 1614 in FIG. 18 are the same as described with reference to FIG. 16. However steps 1604 to 1610 are replaced with pupil-plane detection steps:

In step 1804: Measure the −1st order and +1st order intensity in the pupil-plane, for example using sensor 19 in FIG. 3a.

In step 1806: Calculate the difference between −1st order and +1st order intensities to determine asymmetry, for example using processing unit PU in FIG. 3a.

FIG. 19 is a flow chart of a method in accordance with another embodiment of the present invention using pupil-plane detection scatterometry. As for FIG. 18 (for the dose exposure perturbation example), the following description of FIG. 19 has dose as the exposure perturbation and may use underfilled targets as illustrated in FIGS. 7 and 12. The steps 1600, 1602 and 1702 in FIG. 19 are the same as described with reference to FIG. 17. However, compared to FIG. 17, steps 1604 to 1610 are replaced with pupil-plane detection steps 1804 and 1806 described with reference to FIG. 18.

Focus measurements may be performed on substrates that were exposed by a lithographic apparatus using exposure conditions defined by recipes that vary exposure dose across a substrate in order to optimize CD uniformity. These CD uniformity optimization sub-recipes may typically apply dose fingerprint (i.e. pattern across the wafer) corrections to optimize CD performance after etch, up to 5%. As a result, a significant impact from dose cross talk is apparent, arising from typical lithographic apparatus and lithocell or cluster (including bake plate) effective dose variation. Typically, 1.5-2% variations are expected. Furthermore, at least some dose variation may not be a random component and thus can manifest itself as a systematic dose-to-focus cross talk term, leading to errors in defocus fingerprint determination.

Since the applied dose corrections from such CD uniformity optimization are known, these dose corrections may be used to reduce the dose cross talk effect on measured focus.

During the initial calibration, the target asymmetry response, for example the asymmetric side wall angle (SWA) response, of an asymmetric focus target structure is recorded as a function of focus and dose, similar to the data shown in the graph of FIG. 9.

During measurement of the asymmetric focus-sensitive target, the expected dose (from the recorded information about exposure dose used to produce the focus-sensitive target) is calculated for the asymmetric target position on the wafer.

This calculation is then used to find the corresponding calibration curve that is optimal to use in order to minimize dose cross talk.

The final reported focus value is thus corrected for known dose offsets, and so focus measurement accuracy is increased.

There is another source of variation on focus during exposure. A lithographic apparatus focus (leveling) system may be used to measure the substrate surface height, in order to apply focus adjustments. Different lithographic apparatuses may have different focus offsets, determined by calibration. During initial focus model calibration, the focus settings in a model may be compensated by a lithographic apparatus set focus error. Calibration accuracy is thus improved. However, local defocus may not be completely compensated for. During subsequent production wafer measurements, the calculated focus can be reported together with previously-recorded set focus error. Depending on the application (monitor or feedback), the recorded set focus can be used to improve overall accuracy. In examples described herein, these focus deviations for each lithographic apparatus may be recorded and can be used to correct for set focus error. Moving average recordings of leveling data (measured substrate surface height, corresponding to focus deviation) may also be taken into account to improve focus determination accuracy. Information from any other leveling or focus determining sensor or apparatus may also be taken into account to improve focus determination accuracy. Scanner servo information may also be taken into account to improve focus determination accuracy.

This method may be performed as follows, with reference to FIG. 20, with dose as the exposure perturbation and in which steps 1600, 1604, 1606 and 1614 are in common with the steps of FIG. 16 (for the dose exposure perturbation example):

In step 1600: Measure the grating asymmetry as a function of focus and dose. The results of such measurements are similar to those shown in the graph of FIG. 9.

In step 2002: Process a wafer using a lithographic apparatus to produce a focus-sensitive structure (in this example a focus-sensitive grating) on a wafer and record information on the dose and focus corrections used to produce the focus-sensitive grating.

In step 1604: Measure −1st order scatterometry image using a 1st illumination mode.

In step 1606: Measure +1st order scatterometry image using a 2nd illumination mode.

In step 2008: Recognise & extract each region of interest (ROI) from each image.

In step 2010: Calculate a difference (between −1st and +1st order measurements) image to determine asymmetry.

In step 2012: Receive information about exposure dose used to produce the first structure. In this example the information is in the form of dose corrections applied in the production of the focus-sensitive structure using the lithographic process, recorded in step 2002. Use the recorded dose correction for the respective focus-sensitive grating (for example taking into account its substrate location) to determine which calibration curve to select for that focus-sensitive grating.

In step 1614: Use the determined calibration curve and the determined focus-sensitive grating asymmetry to determine defocus.

In step 2016: Use the recorded focus correction for the grating to correct the determined defocus.

This method similar to that described with reference to FIG. 20 may be performed using pupil-plane detection scatterometry as shown by FIG. 21, with dose as the exposure perturbation and in which all steps are in common with the steps of FIGS. 16, 18 and 20 (for the dose exposure perturbation example).

Aberration Perturbations

For asymmetric focus-sensitive targets used for focus determination, the inventors have found that unwanted aberration sensitivities of focus-sensitive targets lead to unwanted increase in focus measurement errors.

Furthermore, in known overlay target designs special effort is made to minimize the aberration sensitivity in the printing of overlay targets. This is done through an extensive overlay target type (computational) evaluation, where target aberration sensitivities are evaluated and ranked.

Aberration sensitivity minimization for overlay targets is only one of the cost functions that need to be minimized during overlay target optimization. In practice, a compromise between all optimization cost functions needs to be made to obtain an optimal overlay target design. Furthermore, minimization of aberration sensitivity for overlay targets had its' limits, and the perfectly insensitive overlay target does not exist. As such, there will always be a residual overlay penalty due to residual aberration sensitivity.

Asymmetric focus-sensitive targets are only known to be used for inter-field (across wafer) measurements. A person skilled in the art considering extending this capability towards intra-field (across the slit in the scanner exposure field) capability would contemplate a similar approach as is used for overlay targets: minimize the impact of aberration sensitivity of focus-sensitive targets. However, focus-sensitive targets already have to fulfill an extensive set of cost functions (focus sensitivity, dose insensitivity, write error insensitivity, small asymmetry value at Best Focus, etc.). Adding yet another cost function during optimization will make the optimization more complex, and most probably a good-enough optimized target cannot be found. To summarize: aberration sensitivity of focus-sensitive targets limits the application capability to inter-field measurement capability, and intra-field measurement capability has not previously been met with sufficient accuracy.

It has been found by the inventors that in such focus-sensitive target optimizations these focus-sensitive targets can exhibit strong sensitivity to aberrations. These are sensitivities towards both the even (typically focus-related) and the odd (typical overlay, or pattern shift-related) Zernike terms. This is illustrated in FIGS. 22 and 23, where the aberration sensitivity of an optimized focus-sensitive target is presented.

FIG. 22 is a graph of calculated aberration sensitivity AS (in nm) of a typical focus-sensitive target, for a selection of the lowest Zernike terms (ZT). The corresponding "right-fingered" focus sensitive target 2202 is shown inset.

FIG. 23 is a graph of calculated aberration sensitivity of a focus-sensitive target being mirrored with respect to that of FIG. 22, for a selection of the lowest Zernike terms (ZT). The corresponding "left-fingered" focus sensitive target 2302 is shown inset.

As can be seen from the bars in the graph the mirrored target design 2302 of FIG. 23 gives different (similar magnitude yet opposite sign) aberration sensitivity for the odd aberrations ZT=Z7, Z10, Z14 shown (and also, but not shown, Z19, Z23, Z26, Z34) and identical (same sign) for even aberrations ZT=Z4, Z5, Z9, Z12 (and also, but not shown, Z16, Z17, Z25, Z28, Z32, Z36) compared to the target 2202 of FIG. 22.

It is possible to use the subtraction of these two asymmetry signals to reveal the total odd aberration level. The evaluation of the asymmetry signal of only one of the two targets 2202 or 2203 provides the total (odd and even) aberration level. Note that in this example, since it is possible to place both targets very close together, it is expected that both targets suffer the same aberration level of the lithographic apparatus (scanner). Thus, as a result an aberration measurement (odd and total) capability is enabled through the measurement of a target asymmetry.

FIG. 24 schematically illustrates a combined focus- and aberration-sensitive target 2402, suitable for dark-field image-detection scatterometry. Although only three periods of each grating are shown, this is only to represent the type of grating. The patterns are not to scale and in practice will be smaller and repeated in the vertical and horizontal directions. The gratings labeled FSV and FSH are focus-sensitive asymmetric gratings, as described with reference to FIG. 7, with lines in horizontal and vertical directions respectively. The gratings labeled FSVM and FSHM are mirrored versions of FSV and FSH respectively, with lines in horizontal and vertical directions respectively.

As discussed above, for an example with dose as an exposure perturbation, FIG. 16 is a flow chart of a method using measurement of an exposure perturbation-sensitive target in accordance with an embodiment of the present invention, using dark-field scatterometry. The following description of FIG. 16 has aberration (rather than dose) as the exposure perturbation and uses a target as illustrated in FIG. 24. For the following description with reference to FIGS. 16 and 17, only the vertical gratings will be mentioned, although the horizontal gratings may also be used, in order to separately measure Y and X focus behavior. The steps are:

In step 1600: Measure or simulate the grating asymmetry as a function of focus and aberration. Both the focus and aberration can be adjusted in a lithographic apparatus such as a scanner, to facilitate this measurement. Normally, focus (like dose) is readily adjustable and is often controlled with feedback from manufactured wafers. Aberration can also be adjusted, although it is usually optimized during setup in order to reduce aberrations, rather than regularly adjusted to control the scanner. Therefore, although less accurate (because assumptions have to be made in the model) simulation of asymmetry as a function of aberration becomes more reasonable, compared to changing scanner aberration settings in order to make physical measurements. Some results of such simulations are shown in the graph of FIGS. 22 and 23, discussed above.

In step 1602: Process a wafer using lithographic apparatus to produce a focus-sensitive grating, FSV, and a differently focus-sensitive and differently aberration-sensitive grating, FSVM, on the wafer.

In step 1604: Measure −1st order scatterometry image using a 1st illumination mode.

In step 1606: Measure +1st order scatterometry image using a 2nd illumination mode.

In step 1608: Recognise & extract each grating region of interest (ROI) from each image.

In step 1610: Calculate a difference (between −1st and +1st order measurements) image of each grating to determine asymmetry.

In step 1612: Use the aberration-sensitive grating, FSVM, asymmetry to determine a calibration curve for the focus-sensitive grating, FSV. This may be performed by first subtracting the determined asymmetry of the two gratings to reveal the total odd aberration level. Once the aberration level (i.e. exposure perturbation) used to produce the focus-sensitive gratings FSV and FSVM is known, it can be used to construct a calibration curve or select a modeled calibration curve (obtained in step 1600) for use in determining the focus from the asymmetry of FSV (or alternatively FSVM).

In step 1614: Use the determined calibration curve and focus-sensitive grating FSV (or alternatively FSVM) asymmetry to determine defocus.

FIG. 17 is a flow chart of a method in accordance with another embodiment of the present invention, using dark-field scatterometry. The following description of FIG. 17 has aberration as the exposure perturbation and uses a target as illustrated in FIG. 24, but uses the grating asymmetries differently to determine focus. The steps 1600 to 1610 are the same as described with reference to FIG. 16 (for the aberration exposure perturbation example), followed by the step:

In step 1702: Use the aberration-sensitive grating, FSVM, asymmetry and focus-sensitive grating, FSV, asymmetry in multi-dimensional model to determine defocus. The multi-dimensional model may be obtained from simulation, as described with reference to step 1600 (for the aberration exposure perturbation example).

Thus in some embodiments of the present invention, it is proposed to use information of a scatterometer target pair to decouple the impact of aberration cross-talk terms from the actual scanner defocus value, as measured on the original target.

The information from the asymmetric aberration-sensitive target pairs can be used in the following ways:

a) In a feed-forward type application, use information from an aberration-sensitive target pair to feed as input for selecting the correct calibration curve of the focus target, as described with reference to FIG. 16 (for the aberration exposure perturbation example), and, if desired, repeat this iteratively.

b) In a joint optimization scheme, use signals of an aberration-sensitive target pair, e.g. FSV and FSVM in FIG. 24, produced using pattern 702 in FIG. 7 and its mirror image, with the signal from one of the pair, to create a multidimensional model to infer focus and aberration information.

FIG. 25 schematically illustrates a combined focus-, aberration- and dose-sensitive target 2502, suitable for dark-field image-detection scatterometry. As for FIG. 24, although only three periods of each grating are shown, this is only to represent the type of grating. The gratings labeled FSV and FSVM are again focus-sensitive asymmetric gratings, as described with reference to FIG. 7, but are mirrored with respect to each other. The grating labeled DSV is a dose-sensitive grating as described with reference to FIGS. 12 and 15. The grating labeled DSVM is mirrored with respect to the grating labeled DSV.

The information from an asymmetric aberration-sensitive target pair and a dose-sensitive target can be used to infer focus, aberration and dose information. For example with reference to FIG. 25, aberration signals of a modeled aberration-sensitive target pair, e.g. FSV and FSVM in FIG. 25, produced using pattern 702 in FIG. 7 and its mirror image, with the signal from a modeled dose-sensitive target e.g. DSV in FIG. 25, produced using pattern 1202 in FIG. 12 or 1002 in FIG. 10, is used to simulate a set of focus calibration curves as a function of aberration and dose, or to create the multidimensional model to infer focus, aberration and dose information.

As described with reference to FIGS. 24 and 25, the aberration-sensitive pairs and dose-sensitive gratings do not have to be physically apart. They can be one physical target. A detection method such as described with reference to FIG. 16 allows separation of aberration-sensitive, focus-sensitive and dose sensitive information with one pass of the inspection apparatus. These targets may also be combined on a single location on the wafer, for example by orthogonal placement of both target structure types (aberration sensitive target in horizontal direction; focus sensitive targets in vertical direction). This is suitable for pupil-plane detection scatterometry mode.

Pupil-plane detection scatterometry may also be used with aberration as the exposure perturbation, as illustrated by FIGS. 18 and 19 alone as an alternative to or in combination with dark-field image-detection scatterometry (as described for FIGS. 6, 16 and 17) to obtain the scatterometry signals, for use according to embodiments of the present invention.

FIG. 18 is a flow chart of a method in accordance with an embodiment of the present invention using pupil-plane detection scatterometry. The following description of FIG. 18 has aberration as the exposure perturbation and may use underfilled targets as illustrated in FIG. 7, with a corresponding mirrored target. The steps 1600, 1602, 1612 and 1614 in FIG. 18 are the same as described with reference to FIG. 16 (for the aberration exposure perturbation example). However steps 1604 to 1610 are replaced with pupil-plane detection steps:

In step 1804: Measure the −1st order and +1st order intensity in the pupil-plane, for example using sensor 19 in FIG. 3a.

In step 1806: Calculate the difference between −1st order and +1st order intensities to determine asymmetry, for example using processing unit PU in FIG. 3a.

FIG. 19 is a flow chart of a method in accordance with another embodiment of the present invention using pupil-plane detection scatterometry. As for FIG. 18 (for the aberration exposure perturbation example), the following description of FIG. 19 also has aberration as the exposure perturbation and may use underfilled targets as illustrated in FIG. 7, with a corresponding mirrored target. The steps 1600, 1602 and 1702 in FIG. 19 are the same as described with reference to FIG. 17 (for the aberration exposure perturbation example). However, compared to FIG. 17 (for the aberration exposure perturbation example), steps 1604 to 1610 are replaced with pupil-plane detection steps 1804 and 1806 described with reference to FIG. 18 (for the aberration exposure perturbation example).

Focus measurements may be performed on substrates that were exposed by a lithographic apparatus using exposure conditions with optimized aberration settings defined by lens actuator settings, such as those used to minimize aberration across a scanner slit. As a result, aberration cross talk may be apparent, arising from typical aberration variation. Furthermore, at least some aberration variation may not be a random component and thus can manifest itself as a systematic aberration-to-focus cross talk term, leading to errors in intra-field defocus determination.

Since the applied aberration corrections from such CD uniformity optimization are known, these aberration corrections may be used to reduce the aberration cross talk effect on measured focus.

During the initial calibration, the target asymmetry response, for example the asymmetric side wall angle (SWA) response, of an asymmetric focus target structure is simulated as a function of focus and aberration, similar to the data shown in the graph of FIG. 9, but for different aberration setting, rather than dose.

During measurement of the asymmetric focus-sensitive target, the expected aberration (from the recorded information about exposure aberration used to produce the focus-sensitive target) is calculated for the asymmetric target position in the exposure field on the wafer.

This calculation is then used to find the corresponding calibration curve that is optimal to use in order to minimize aberration cross talk.

The final reported focus value is thus corrected for known aberration offsets, and so focus measurement accuracy is increased.

This method may be performed as follows, with reference to FIG. 20, with aberration as the exposure perturbation and in which steps 1600, 1604, 1606 and 1614 are in common with the steps of FIG. 16 (for the aberration exposure perturbation example):

In step 1600: Measure the grating asymmetry as a function of focus and aberration. The results of such measurements are similar to those shown in the graph of FIG. 9, but for different aberration setting, rather than dose.

In step 2002: Process a wafer using a lithographic apparatus to produce a focus-sensitive structure (in this example a focus-sensitive grating) on a wafer and record information on the aberration and focus corrections used to produce the focus-sensitive grating.

In step 1604: Measure −1st order scatterometry image using a 1st illumination mode.

In step 1606: Measure +1st order scatterometry image using a 2nd illumination mode.

In step 2008: Recognise & extract each region of interest (ROI) from each image.

In step 2010: Calculate a difference (between −1st and +1st order measurements) image to determine asymmetry.

In step 2012: Receive information about exposure aberration used to produce the first structure. In this example the information is in the form of aberration corrections applied in the production of the focus-sensitive structure using the lithographic process, recorded in step 2002. Use the recorded aberration correction for the respective focus-sensitive grating (for example taking into account its location in the exposure field) to determine which calibration curve to select for that focus-sensitive grating.

In step 1614: Use the determined calibration curve and the determined focus-sensitive grating asymmetry to determine defocus.

In step 2016: Use the recorded focus correction for the grating to correct the determined defocus.

This method similar to that described with reference to FIG. 20 (for the aberration exposure perturbation example) may be performed using pupil-plane detection scatterometry as shown by FIG. 21, with aberration as the exposure perturbation and in which all steps are in common with the steps of FIGS. 16, 18 and 20 (for the aberration exposure perturbation example).

Aberration-sensitive targets described herein have other application in focus measurements. Using the aberration-sensitive targets, a monitoring of inter-field process variations (such as resist bake plate variations, across-wafer dose variations, resist loss, etc.) also becomes possible. This is discussed below with reference to FIGS. 27 and 28. But first, it is useful to consider in detail the exposure of resist arising from an aberration-sensitive target pair in response to focus change.

FIG. 26 schematically illustrates resist profile behavior of mirrored asymmetric targets as a function of focus F. The aerial images arising during exposure of focus sensitive target patterns FSV and FSVM are depicted by the dashed-line contours enclosed by outer contours 2602 and 2604 respectively. The resulting resist profiles after a develop step, 2608 and 2610 respectively, arise from exposure of the resist where the aerial image intersects the resist. At the center of the focus F, between +and −, the unshifted center of gravity of the resist profiles 2612 and 2614 is shown as a vertical dotted line through the center of each resist profile. For focus shifts either positive or negative, the aerial image is intersected by the resist layer at a different position, giving rise to different resist profile shapes as a function of focus. The small horizontal arrows indicate the direction of shift of the respective center of gravity of the resist profiles compared to the center of focus. It can be seen that the focus-sensitive and focus-sensitive mirrored targets have inverted focus-sensitivity with respect to each other.

FIG. 27 schematically illustrates the impact on resist patterns of mirrored asymmetric targets resulting from odd Zernike terms arising from intra-field aberration variation. Odd-theta aberration, depicted by the Zernike polynomial 2702, in this example causes a shift to the left of the center of gravity of the resist profiles 2704 and 2706. This type of aberration therefore affects overlay in relation to other underlying or overlying patterned layers. Note that the shift is in the same direction for resist patterns arising from FSV and FSVM, irrespective of the mirroring.

FIG. 28 schematically illustrates the impact on resist patterns of mirrored asymmetric targets resulting from inter-field process-induced variation. Asymmetric resist loss resulting from the processing non-uniformity at post-exposure bake and/or develop can lead to resist profiles 2802-2808 as shown in FIG. 28. Note that a shift to the right of the center of gravity of the resist profiles in this example is in the same direction for resist patterns arising from FSV and FSVM, irrespective of the mirroring.

Thus it can be seen that the overlay-affecting-type aberrations and process-induced asymmetry both result in a shift in the same direction irrespective of whether the target (FSV or FSVM) is mirrored or not. Therefore, using mirrored targets, overlay-affecting-type aberrations (intra-field) as well as process uniformity (inter-field) can be monitored. A potential application of this latter (inter-field) capability is as process flag (detecting process outliers) to accompany measurement of focus-sensitive targets.

FIG. 29 schematically illustrates a combined focus-, aberration- and overlay-sensitive target, suitable for dark-field image-detection scatterometry. Such a target has an application in correcting overlay measurements for aberration. With reference to FIG. 29, an overlay target OV is placed in close proximity to an aberration-sensitive pair (aberration monitor) target, with similar printed characteristics (CD and pitch), comprising FSV and FSM. The diffraction orders' position in the scanner pupil, of the OV and aberration-sensitive pair FSV and FSM, must be substantially identical to ensure similar sensitivities for scanner aberrations. This effectively means that both the overlay-sensitive and aberration-sensitive pair targets must have equal pitch. In this configuration, it is expected that the aberration induced (intra-field) overlay penalty, due to aberration sensitivity of overlay targets, can be reduced. This reduction is achieved through a feed-forward correction of the measured (odd) aberration level of the scanner via the aberration-sensitive pair targets, to the measurement of overlay using the overlay target.

FIG. 30 schematically illustrates combined focus-, aberration- and dose-sensitive targets, suitable for dark-field image-detection scatterometry. The aberration level can be determined by comparing the asymmetry determined from gratings FSV (Focus-Sensitive, Vertical lines) and DSVM (Dose-Sensitive, Vertical lines, Mirrored). Thus for the vertical lines, only two targets are used, of the four sites in the combined target. This efficient use of real estate on the wafer means that the other two sites can be used for combined focus-, aberration- and dose-sensitive targets with horizontal lines, FSH and DSHM. When this target is used, the methods discussed with reference to FIGS. 16 to 19 still apply, but exposure perturbation relates to both aberration and dose.

Using a combination of signals obtained from two targets that have different focus sensitivity, yet similar aberration-sensitivity will further help to reduce focus measurement errors due to aberrations. This example is discussed with reference to FIGS. 31-33 below. This idea can be used with aberration-sensitive target pairs being used for both improved focus measurement accuracy and improved overlay measurement accuracy via feed-forward correction mechanisms.

A first indication that aberration sensitivity of different target designs can be similar is illustrated in FIGS. 31 and 32.

FIGS. 31 and 32 are graphs of aberration-induced asymmetry errors (summed for all aberrations; odd and even) as a function of distance across the scanner slit X (in mm) for two different target designs. Here the aberration induced asymmetry errors are translated into focus errors FE (in nm) via the asymmetry/focus calibration curve. For FIG. 31, the target dimensions, in terms of the parameters w1, w2 and w3 illustrated in FIG. 7 are 320, 20 and 110 nm respectively. For FIG. 32, the target dimensions, in terms of those parameters w1, w2 and w3 are 290, 24 and 110 nm respectively.

These two targets (referred to with reference to FIGS. 31 and 32) differ in typical target characteristic such as printed CD, but are identical in pitch. From the graphs in FIGS. 31 and 32, it is clearly visible that the aberration induced errors through the slit are similar for both targets. This similarity is further illustrated by FIG. 33, which is a graph of the difference between the aberration-induced asymmetry errors (summed for all aberrations; odd and even) shown in FIGS. 31 and 32. FIG. 34 is a graph of asymmetry versus focus for the targets corresponding to FIGS. 31, 32 and 33, with triangular, diamond and square markers respectively. Using the difference between the aberration-induced asymmetry errors (square markers) results in less sensitivity of the aberration signal to focus, but has the benefit of greatly reduced aberration sensitivity.

Example embodiments that have been disclosed above relate to exposure-perturbation-corrected diffraction-based focus measurements using a focus-sensitive target with knowledge of the exposure perturbation to calculate a focus value.

In example embodiments the knowledge of exposure perturbation may be provided by measurement of perturbation-sensitive targets with different focus sensitivity and different perturbation sensitivity.

Embodiments include (where FS=focus sensitive target, DS=dose sensitive target, OV=overlay sensitive target and FS+FS_mirrored=aberration-sensitive target pair):

(A) FS+DS (different focus-sensitivity and different dose sensitivity) for dose-corrected diffraction-based focus measurement, as illustrated with reference to the targets of FIGS. 14 & 15 and flowcharts of FIGS. 16-19.

(B) FS+scanner dose settings for dose-corrected diffraction-based focus measurement, as illustrated with reference to the target of FIG. 7 and the flowcharts of FIGS. 20-21.

(C) FS+FS_mirrored (inverted focus-sensitivity and different aberration sensitivity) for aberration-corrected diffraction-based focus measurement, allowing intra-field diffraction-based focus measurement, as illustrated with reference to the target of FIG. 24 and the flowcharts of FIGS. 16-19.

(D) DS+FS+FS_mirrored (inverted focus-sensitivity and different aberration sensitivity) for aberration- and dose-corrected diffraction-based focus measurement, as illustrated with reference to the target of FIG. 25 and the flowcharts of FIGS. 16-19.

(E) FS+DS_mirrored (different focus-sensitivity and different aberration sensitivity and different dose sensitivity) for aberration- and dose-corrected diffraction-based focus measurement, as illustrated with reference to the target of FIG. 30.

(F) FS+scanner aberration (lens actuator) settings for aberration-corrected diffraction-based focus measurement, as illustrated with reference to the target of FIG. 7 and the flowcharts of FIGS. 20-21.

(G) FS+FS_mirrored (inverted focus-sensitivity and different aberration sensitivity) for on-product aberration monitoring, as illustrated with reference to the target of FIG. 24.

(H) OV+FS+FS_mirrored (inverted focus-sensitivity and different aberration sensitivity) for aberration-corrected diffraction-based overlay measurement, as illustrated with reference to the target of FIG. 29.

(I) FS+FS_mirrored (inverted focus-sensitivity and different "aberration-like process-induced asymmetry" sensitivity) for monitoring inter-field process variations (and as a process flag for diffraction-based focus measurements), as illustrated with reference to the target of FIG. 24.

(J) FS+FS_mirrored (inverted focus-sensitivity and similar aberration sensitivity) for improved (aberration-insensitive) diffraction-based focus measurement, as illustrated with reference to FIGS. 31-34.

Although the 1st diffraction order intensity signal differences are used in embodiments described above to determine asymmetry, the asymmetry information is present in higher diffraction orders. Any scatterometer signal generation and processing that gives a clear relation between focus an asymmetry will be suitable. Embodiments of the present invention are therefore not limited to using 1st order scatterometry signal differences.

Example embodiments improve focus measurement accuracy and reduce constraints on target design (relax requirements on minimizing cost function for dose cross-talk). Furthermore, in embodiments, scanner dose and/or aberration can be determined, while simultaneously improving scanner focus accuracy. In practice, these dose and aberration sensitive targets may be measured at only a few points on the wafer.

Example embodiments using aberration-sensitive targets lead to:

Improved accuracy of OV measurements, when performed with angular resolved scatterometers;

Relaxation of cost function requirements for aberration insensitivity of overlay targets;

Scanner monitoring capability (on-product) of total aberration level of a scanner, thus facilitating fault detection;

Monitoring of process changes (inter-field) on focus measurement accuracy via the monitoring of aberration-sensitive targets;

Monitoring of asymmetry of printed overlay targets (second layer printed in resist), indirectly via the aberration-sensitive targets;

In general: monitoring of asymmetry (variations, excursions) of printed structures in resist via dedicated aberration-sensitive measurements. Asymmetry can be from various sources such as aberrations, process variations, etc.; and Improvement of Focus measurement accuracy, extending capability towards intra-field focus measurements.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A patterning device comprising a target pattern, the target pattern comprising:
    a first sub-pattern configured to produce a first structure on a substrate using a lithographic process, the first structure having a first feature having a first asymmetry, the first asymmetry having a first focus sensitivity to a focus value and a first exposure dose sensitivity to an exposure perturbation parameter of a lithographic apparatus used in the lithographic process; and
    a second sub-pattern configured to produce a second structure on the substrate using the lithographic process, the second structure having a second focus sensitivity to the focus value and a second exposure dose sensitivity to the exposure perturbation parameter of the lithographic apparatus, wherein:
        the first and second focus sensitivities are different from each other; and
        the first and second exposure dose sensitivities are different from each other.

2. The patterning device of claim 1, wherein the second structure has a second feature having a second asymmetry, the second asymmetry having the second exposure dose sensitivity.

3. The patterning device of claim 1, wherein the exposure perturbation parameter comprises an aberration parameter.

4. The patterning device of claim 1, wherein the exposure perturbation parameter comprises an exposure dose value.

5. The patterning device of claim 1, wherein the first and second sub-patterns are arranged in a mirrored orientation with respect to each other.

6. The patterning device of claim 1, wherein:
    magnitudes of the first and second exposure dose sensitivities are equal to each other; and
    signs of the first and second exposure dose sensitivities are opposite to each other.

7. The patterning device of claim 1, wherein the first and second sub-patterns are configured to produce the first and second structures, respectively, for dark-field image detection scatterometry.

8. The patterning device of claim 1, wherein the first and second sub-patterns are configured to produce the first and second structures, respectively, for pupil-plane detection scatterometry.

9. The patterning device of claim 1, wherein the first or second feature comprises a sidewall of the first or second structure, respectively.

10. The patterning device of claim 1, wherein the first or second asymmetry comprises an asymmetric side wall angle of the first or second structure, respectively.

11. A patterning device for determining a focus value of a lithographic apparatus used in a lithographic process on a substrate, the patterning device comprising:
    a target pattern comprising:
        a first sub-pattern configured to produce a first structure on the substrate using the lithographic process, the first structure having a first feature having a first asymmetry, the first asymmetry having a first exposure dose sensitivity to an exposure perturbation parameter of the lithographic apparatus used in the lithographic process; and
        a second sub-pattern configured to produce a second structure on the substrate using the lithographic process, the second structure having a second feature having a second asymmetry, the second asymmetry having a second exposure dose sensitivity to the exposure perturbation parameter of the lithographic apparatus, the first and second exposure dose sensitivities being different from each other.

12. The patterning device of claim 11, wherein the exposure perturbation parameter comprises an aberration parameter.

13. The patterning device of claim 11, wherein the exposure perturbation parameter comprises an exposure dose value.

14. The patterning device of claim 11, wherein the first asymmetry has a first focus sensitivity to the focus value of the lithographic apparatus used in the lithographic process.

15. The patterning device of claim 11, wherein the second asymmetry has a second focus sensitivity to the focus value of the lithographic apparatus used in the lithographic process.

16. The patterning device of claim 11, wherein the first and second sub-patterns are arranged in a mirrored configuration with respect to each other.

17. A substrate for determining a focus value of a lithographic apparatus used in a lithographic process, the substrate comprising:
    a first structure having a first feature having a first asymmetry, the first asymmetry having a first focus sensitivity to a focus value and a first exposure dose sensitivity to an exposure perturbation parameter of the lithographic apparatus used in the lithographic process; and
    a second structure having a second focus sensitivity to the focus value and a second exposure dose sensitivity to the exposure perturbation parameter of the lithographic apparatus,
    wherein:
        the first and second focus sensitivities are different from each other; and
        the first and second exposure dose sensitivities are different from each other.

18. The substrate of claim 17, wherein the second structure has a second feature having a second asymmetry, the second asymmetry having the second exposure dose sensitivity.

19. The substrate of claim 17, wherein the exposure perturbation parameter comprises an aberration parameter.

20. The substrate of claim 17, wherein the exposure perturbation parameter comprises an exposure dose value.

\* \* \* \* \*